United States Patent
Leung

(10) Patent No.: US 6,496,437 B2
(45) Date of Patent: Dec. 17, 2002

(54) METHOD AND APPARATUS FOR FORCING IDLE CYCLES TO ENABLE REFRESH OPERATIONS IN A SEMICONDUCTOR MEMORY

(75) Inventor: Wingyu Leung, Cupertino, CA (US)

(73) Assignee: Monolithic Systems Technology, Inc., Sunnyvale, CA (US)

( * ) Notice: Subject to any disclaimer, the term of this patent is extended or adjusted under 35 U.S.C. 154(b) by 144 days.

(21) Appl. No.: 09/795,750

(22) Filed: Feb. 27, 2001

(65) Prior Publication Data
US 2001/0008496 A1 Jul. 19, 2001

Related U.S. Application Data

(63) Continuation-in-part of application No. 09/234,778, filed on Jan. 20, 1999, now Pat. No. 6,222,785.

(51) Int. Cl.[7] .................................................. G11C 8/00
(52) U.S. Cl. ...................................... 365/222; 365/236
(58) Field of Search ........................... 365/222, 230.03, 365/233, 236

(56) References Cited

U.S. PATENT DOCUMENTS

| 559,750 A | 9/1896 | Dosaka et al. | 365/230.06 |
|---|---|---|---|
| 4,549,284 A | 10/1985 | Ikuzaki | 365/222 |
| 5,033,027 A | 7/1991 | Anmin | 365/222 |
| 5,802,555 A | 9/1998 | Shigeeda | 711/106 |
| 5,822,265 A | 10/1998 | Zdenek | 365/222 |
| 5,873,114 A | 2/1999 | Rahman et al. | 365/222 |
| 5,999,474 A | 12/1999 | Leung et al. | 365/222 |
| 6,028,804 A | 2/2000 | Leung | 365/222 |
| 6,075,740 A | 6/2000 | Leung | 365/222 |
| 6,078,547 A | 6/2000 | Leung | 365/233 |
| 6,256,248 B1 * | 7/2001 | Leung | 365/222 |
| 6,259,651 B1 * | 7/2001 | Leung | 365/233 |

FOREIGN PATENT DOCUMENTS

| EP | 0 794 497 A2 | 9/1997 | G06F/13/16 |
|---|---|---|---|
| GB | 2 265 034 A | 9/1993 | G11C/11/406 |

OTHER PUBLICATIONS

"16Mbit Synchronous DRAM", IBM Corp., Revised 5/96, pp. 1–100, 1996.
Direct Rambus Technology Disclosure 1997; Rambus Inc., Oct. 15, 1997, pp. 1–48.
"DM2202/2212 EDRAM 1Mbx4 Enhanced Dynamic RAM", Ramtron Intl. Corp., pp. 2–17–2–33, 1994.
"Dynamic CMOS RAM", NEC Electronics, Inc., pp. 6–101–6–113, 1991.
"Pentium Processor 3.3V Pipelined BSRAM Specification", Ver. 2.0, May 25, 1995, pp. 1–44.
"400 Mb/s/pin SLDRAM", SLDRAM CONSORTIUM, Rev. Sept. 22, 1997, pp. 1–59.

* cited by examiner

Primary Examiner—Trong Phan
(74) Attorney, Agent, or Firm—E. Eric Hoffman; Bever, Hoffman & Harms, LLP

(57) ABSTRACT

A method is provided for operating a memory system having a plurality of memory blocks. The method includes (1) periodically asserting a timing signal; (2) asserting a refresh pending signal in each of the memory blocks when the asserted timing signal is received; (3) within each of the memory blocks, performing a refresh operation if the refresh pending signal in the memory block is asserted and an idle cycle exists in the memory block; (4) within each of the memory blocks, asserting a refresh acknowledge signal if a refresh operation is performed in the memory block; (5) within each of the memory blocks, de-asserting the refresh pending signal in the memory block if the refresh acknowledge signal is asserted in the memory block; (6) asserting a refresh forcing signal if the refresh pending signal in any of the memory blocks is asserted when the timing signal is asserted; and (7) forcing an idle cycle in all of the memory blocks if the refresh forcing signal is asserted. A memory system for implementing this method is also provided.

26 Claims, 14 Drawing Sheets

METHOD AND APPARATUS FOR FORCING IDLE CYCLES TO ENABLE REFRESH OPERATIONS IN A SEMICONDUCTOR MEMORY

RELATED APPLICATIONS

The present application is a continuation-in-part of U.S. patent application Ser. No. 09/234,778, which is U.S. Pat. No. 6,222,785, by Wingyu Leung, entitled "Method And Apparatus For Refreshing A Semiconductor Memory Using Idle Memory Cycles" filed Jan. 20, 1999.

FIELD OF THE INVENTION

The present invention relates to a semiconductor memory that must be periodically refreshed. More specifically, the present invention relates to a method and apparatus for performing refresh operations in a semiconductor memory during idle cycles of the memory.

DISCUSSION OF RELATED ART

Some conventional semiconductor memories, such as dynamic random access memory (DRAM), must be periodically refreshed in order to retain valid data. During refresh operations, external access typically is not allowed. In addition, a mechanism is required to inform the memory controller that the DRAM is performing a refresh operation. Any pending memory transaction has to be delayed until the refresh operation is completed. Refresh operations therefore lengthen the overall access time for memory accesses. It is therefore important to design a memory system in which the impact of refresh operations on external memory access is minimized.

Many different methods have been proposed to refresh these semiconductor memories. In one of these methods, which is commonly referred to as "CAS before RAS," an external device signals a refresh operation by asserting a column access signal CAS# prior to asserting a row access signal RAS#. During normal accesses, the column address strobe signal RAS# is asserted before the column address strobe signal CAS#. In response to detecting the "CAS before RAS" condition, the memory performs a refresh operation. The refresh operation typically is performed by reading the row of the memory to be refreshed. A "CAS before RAS" refresh scheme is described in 1991 Memory Products Data Book, uPD424248 262,144×4-Bit Dynamic CMOS RAM, NEC Electronics, pp 6–101 to 6–113. This reference also illustrates a hidden refresh that is a variation of the "CAS before RAS" refresh method. These methods for refresh require handshake communication between the semiconductor memory and the external device, making the external device control the memory refresh.

Another conventional semiconductor memory that must be periodically refreshed is synchronous DRAM (SDRAM). One conventional SDRAM initiates refresh operations in response to control signals (i.e., RAS#, CAS#, CS#, WE# and CKE) received from an external device. These control signals are decoded to provide command codes that are used to control the refresh operations of the SDRAM. For example, when the control signals RAS#, CAS#, CS#, WE# and CKE have values of 0,0,0,1, and 1, a control code for initiating an auto refresh operation is generated. Similarly, when those same control signals have values of 0,0,0,1, and 0, a control code for initiating a self refresh operation is generated. This SDRAM is described in more detail IBM0316409C, 16 Mbit Synchronous DRAM data sheet, 1996, IBM Corporation.

Other synchronous DRAM have used explicit command codes for handling memory refresh. These include SLDRAM [4M=18 SLDRAM CONS400.P65—Rev. Sep. 22, 1997, 400 Mb/s/pin SLDRAM SLD4M18DR400 4M=18 SLDRAM Data Sheet, SLDRAM Consortium] and Rambus DRAM (RDRAM). [Direct Rambus Technology Disclosure, Oct. 15, 1997, Rambus Inc.] All of the above-described command codes are generated by the external device, and must be communicated to the memory device, thereby complicating the interface to the semiconductor memory. The interface then becomes incompatible with the interface of a simpler device, such as an SPAM.

Other conventional DRAM refresh schemes incorporate a dedicated refresh control signal. These schemes are exemplified by enhanced DRAM (EDRAM) [DM2202/2212 EDRAM, 1 Mb×4 Enhanced Dynamic RAM, 1994, Ramtron International Corporation] and cache DRAM (CDRAM) [Dosaka et. al, U.S. Pat. No. 5,559,750]. In both the EDRAM and the CDRAM, a dedicated external refresh signal is used to initiate refresh operations. As noted with the external signals of the aforementioned devices, this additional external signal is incompatible with an SRAM and other simple interface devices.

Schemes for performing refresh operations during unused idle memory cycles of a DRAM are described in U.S. Pat. No. 6,078,547 entitled "Method And Structure For Controlling Operation Of A DRAM Array", U.S. Pat. No. 6,028,804 entitled "Method And Apparatus For 1-T SRAM Compatible Memory", U.S. Pat. No. 5,999,474 entitled "Method And Apparatus For Complete Hiding Of The Refresh Of A Semiconductor Memory", and U.S. Pat. No. 6,075,740 entitled "Method And Apparatus For Increasing The Time Available For Refresh For 1-T SRAM Compatible Devices", all by the present inventor.

SUMMARY

Accordingly, the present invention provides a memory system having a memory controller and one or more memory blocks that are commonly coupled to a system bus. Each memory block includes an array of memory cells that must be periodically refreshed to retain valid data. Each memory block also includes a refresh control circuit that refreshes the memory cells during idle cycles of the memory array.

The memory controller includes a refresh manager that monitors the number of idle cycles on the system bus during a refresh period, and forces one or more idle cycles on the system bus if the monitored number of idle cycles is less than a predetermined number of idle cycles during the refresh period. For example, in one embodiment, the refresh period for eight rows of memory cells is 20.48 microseconds. If the refresh manager detects fewer than eight idle cycles on the system bus during the 20.48 microsecond refresh period, then the refresh manager forces the appropriate number of idle cycles onto the system bus at the end of the refresh period. For example, if the refresh manager only detects six idle cycles on the system bus during the refresh period, then the refresh manager will force two additional idle cycles on the system bus at the end of the refresh period. As a result, eight idle cycles are provided on the system bus. Each of the memory blocks performs a pending refresh operation during an idle cycle on the system bus. As a result, the eight rows of memory cells are always refreshed within eight cycles of the end of the refresh period (or shorter). There is a relatively high probability that the refresh manager will not have to force any idle cycles at the end of the refresh period. Moreover, even if idle cycles must be forced, the maximum time required for these idle cycles represents a small fraction of the refresh period (e.g., 0.4 percent).

While idle cycles are being forced, the refresh manager asserts a control signal that informs accessing clients of the memory system that memory accesses must be deferred. After the idle cycles have been forced, the refresh manager de-asserts the control signal to inform the accessing clients that memory accesses can proceed.

In a particular embodiment, the refresh manager includes an idle cycle counter for counting the number of idle cycles on the system bus. When the number of idle cycles on the system bus is equal to the predetermined number of idle cycles, the idle cycle counter generates a FULL signal. A refresh counter is coupled to receive the FULL signal. If the refresh counter determines that the refresh period expires prior to receiving the FULL signal from the idle cycle counter, then the refresh counter asserts a control signal that forces idle cycles on the system bus. If the refresh counter receives the FULL signal prior to the expiration of the refresh period, the refresh counter is reset, thereby beginning a new refresh period.

Within each memory block, an access arbiter receives external access requests (which are initiated by the memory controller) and refresh requests (which are generated within the memory block). The access arbiter always grants priority to any pending external access request. The access arbiter will allow refresh requests to be granted only if there are no pending external access requests. As a result, the refresh requests do not impede the external access requests. The refresh operations are performed during naturally occurring idle cycles or during the forced idle cycles.

In another embodiment, the memory blocks are logically divided into two or more sets. In this embodiment, the refresh manager monitors the number of idle cycles occurring in each set of memory blocks during the refresh period. The refresh manager forces idle cycles on the system bus only if the number of idle cycles occurring in at least one set of memory blocks during the refresh period is less than the predetermined number of idle cycles.

In yet another embodiment of the present invention, the refresh manager is modified to force a predetermined number of idle cycles on the system bus after the refresh period has expired, regardless of the number of idle cycles occurring during the refresh period. For example, the refresh manager can force eight idle cycles at the end of each refresh period.

Another embodiment of the present invention includes the steps of (1) periodically asserting a timing signal; (2) asserting a refresh pending signal in each of the memory blocks upon receiving the asserted timing signal; (3) within each of the memory blocks, performing a refresh operation if the refresh pending signal in the memory block is asserted and an idle cycle exists in the memory block; (4) within each of the memory blocks, asserting a refresh acknowledge signal if a refresh operation is performed in the memory block; (5) within each of the memory blocks, de-asserting the refresh pending signal in the memory block if the refresh acknowledge signal is asserted in the memory block; (6) asserting a refresh forcing signal if the refresh pending signal in any of the memory blocks is asserted when the timing signal is asserted; and (7) forcing an idle cycle in all of the memory blocks if the refresh forcing signal is asserted.

A memory system for implementing this method includes a memory controller, one or more memory blocks and a system bus. The memory controller and each of the memory blocks are coupled to the system bus. Each memory block includes an array of memory cells that must be periodically refreshed, a refresh timer, a refresh detector, an access arbiter, and a logic circuit.

The refresh timer in each block periodically asserts a refresh timing signal. For example, the refresh timer may periodically assert a refresh timing signal every 256 clock cycles. The refresh detector in each block is coupled to receive the refresh timing signal. If the refresh timing signal is asserted, refresh detector will assert a refresh pending signal.

The access arbiter in each block is coupled to receive the refresh pending signal. If the refresh pending signal is asserted, and an idle cycle exists in the memory block, then access arbitrator will enable a refresh operation to be performed in the memory block. Upon enabling a refresh operation, the access arbiter asserts a refresh acknowledge signal.

Within each block, the refresh acknowledge signal is provided to the refresh detector. Each refresh detector receiving an asserted refresh acknowledge signal de-asserts the corresponding refresh pending signal.

Within each block, the logic circuit is coupled to receive the corresponding refresh pending and refresh timing signals. Each logic circuit that receives both an asserted refresh pending signal and an asserted refresh timing signal pulls down on a dedicated refresh line of the system bus. That is, each logic circuit that has not performed a refresh operation by the time the refresh timing signal is asserted pulls down on the refresh line. The signal on the refresh line is referred to as the refresh forcing signal.

The memory controller is coupled to receive the refresh forcing signal on the refresh line of the system bus. If the refresh forcing signal is pulled down to a logic low value, the memory controller forces an idle cycle on the system bus. This enables all of the memory blocks to be properly refreshed.

Another embodiment of the present invention includes a method of operating a memory system having a plurality of memory blocks. This method includes (1) periodically asserting a timing signal; (2) asserting a refresh pending signal in each of the memory blocks upon receiving the asserted timing signal; (3) within each of the memory blocks, performing a refresh operation if the refresh pending signal in the memory block is asserted and an idle cycle exists in the memory block; (4) within each of the memory blocks, asserting a refresh acknowledge signal if a refresh operation is performed in the memory block; (5) within each of the memory blocks, de-asserting the refresh pending signal in the memory block if the refresh acknowledge signal is asserted in the memory block; (6) asserting a refresh forcing signal if the refresh pending signal in any of the memory blocks is asserted when the timing signal is asserted; and (7) forcing an idle cycle in all of the memory blocks if the refresh forcing signal is asserted.

A memory system for implementing this method includes a memory controller, one or more memory blocks and a system bus. The memory controller and each of the memory blocks is coupled to the system bus. Each memory block includes an array of memory cells that must be periodically refreshed, a refresh timer, a refresh detector, an access arbiter, and a logic circuit.

In an alternate embodiment, a common refresh timer can be shared among the memory blocks. This arrangement is particularly suitable in an integrated environment where the entire memory system resides on the same silicon substrate. Furthermore the timing signal generated by the refresh timer can be arranged to propagate through a daisy-chain connecting serially to all the memory blocks. Such a scheme is described in detail in pending U.S. patent application Ser. No. 09/405,607 "Read/Write Buffers For Complete Hiding Of The Refresh of A Semiconductor Memory And Method Of Operating Same" by Wingyu Leung.

The refresh timer in each block periodically asserts a refresh timing signal. For example, the refresh timer may periodically assert a refresh timing signal every 256 clock cycles. The refresh detector in each block is coupled to receive the refresh timing signal. If the refresh timing signal is asserted, refresh detector will assert a refresh pending signal.

The access arbiter in each block is coupled to receive the refresh pending signal. If the refresh pending signal is asserted, and an idle cycle exists in the memory block, then access arbitrator will enable a refresh operation to be performed in the memory block. Upon enabling a refresh operation, the access arbiter asserts a refresh acknowledge signal.

Within each block, the refresh acknowledge signal is provided to the refresh detector. Each refresh detector receiving an asserted refresh acknowledge signal de-asserts the corresponding refresh pending signal.

Within each block, a logic circuit is coupled to receive the corresponding refresh pending signal. Each logic circuit that receives an asserted refresh pending signal pulls down on a dedicated refresh line of the system bus. That is, each logic circuit pulls down on the refresh line until a refresh operation is performed by the memory block. The signal on the refresh line is referred to as the refresh forcing signal.

The memory controller is coupled to receive the refresh forcing signal on the refresh line of the system bus. If the memory controller detects that the refresh line is continuously pulled down to a logic low level for a predetermined time period, then the memory controller forces an idle cycle on the system bus. This enables all of the memory blocks to be properly refreshed.

The present invention will be more fully understood in view of the following description and drawings.

DETAILED DESCRIPTION

In light of the related art, it would be desirable to construct a memory device in which the impact of refresh operations on external memory access is minimized. Accordingly, the present invention provides a memory system in which the majority of refresh operations are carried out within the memory device during idle memory cycles. Idle memory cycles are clock cycles in which there is no on-going or pending memory access to the memory device.

A situation may occur where access to a particular memory block is sustained for a period of time longer than the required time for memory refresh. In this case, the present invention suspends memory access, forcing idle cycles to carry out refresh operations. However, the mechanism of performing a refresh operation in the present invention does not require external signaling, such as using an explicit command code or signal. This allows the implementation of a simple memory interface, such as one compatible with that of an SRAM.

Figure 1:
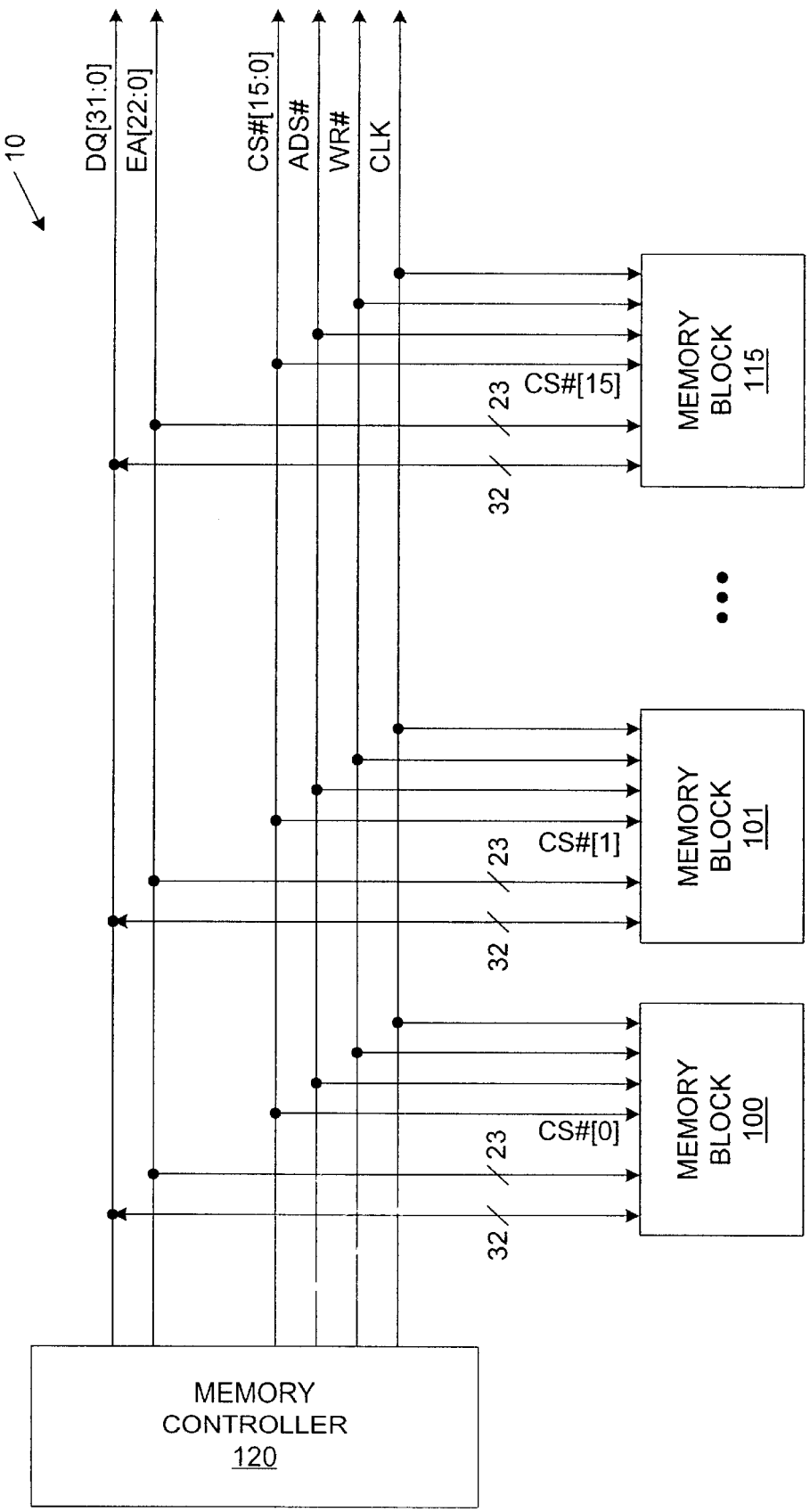
FIG. 1 is a block diagram of a memory system in accordance with one embodiment of the present invention.

FIG. 1 is a block diagram of memory system 10 in accordance with one embodiment of the present invention. Memory system 10 includes memory blocks 100–115 and memory controller 120. Memory controller 120 can be part of a processor or system logic. Each of memory blocks 100–115 includes an array of DRAM cells that requires periodic refresh to retain valid data. Memory blocks 102–114 are not illustrated for purposes of clarity. Although the present embodiment includes memory blocks requiring refresh (e.g. DRAM devices), other memory devices that do not require refresh can also be connected to the same bus as memory blocks 100–115. In an alternate embodiment, the entire memory system 10 can be part of an integrated system residing on a single substrate. Each of memory blocks 100–115 is coupled to receive the following signals from memory controller 120: bi-directional data signals DQ[31:0], external address signals EA[22:0], address strobe signal ADS#, and write/read enable signal WR#. Each of memory blocks 100–115 receives a dedicated chip select CS# signal. For example, memory blocks 100 and 101 receive chip select signals CS#[0] and CS#[1], respectively. A clock signal CLK is provided to synchronize memory transactions between memory blocks 100–115 and memory controller 120.

In the described embodiment, memory blocks 100–115 are identical. However, in other embodiments these memory blocks may include different circuitry. Moreover, although sixteen memory blocks are described, it is understood that there can be other numbers of memory blocks in other embodiments. The number of CS# signals will change accordingly. Additionally, data and address signals having other widths can be used in other embodiments.

Each of memory blocks 100–115 includes one or more memory arrays having multiple rows and columns of DRAM memory cells. Each of memory blocks 100–115 also includes all the conventional circuits associated with a DRAM, such as word line drivers, sense amplifiers, and column multiplexers. In other embodiments, memory blocks 100–115 can additionally include memory arrays that do not require refresh operations.

Figure 2:
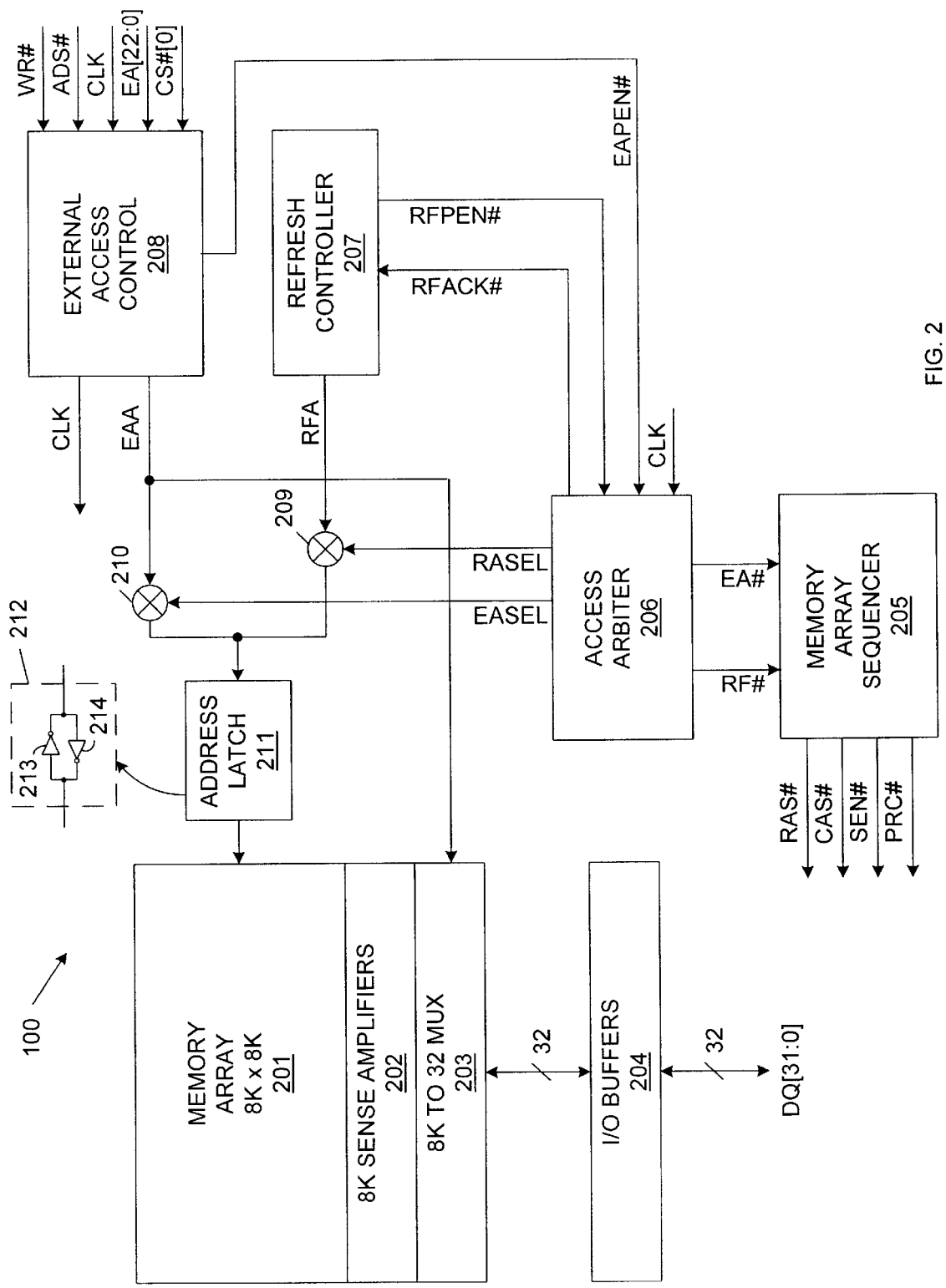
FIG. 2 is a schematic diagram of a memory block for controlling refresh and external access to a memory array in accordance with one embodiment of the present invention.

FIG. 2 is a schematic diagram illustrating memory block 100. Memory block 100 includes memory array 201, sense amplifiers 202, multiplexer 203, I/O buffers 204, memory array sequencer 205, access arbiter 206, refresh controller 207 external access control 208, transmission gates 209 and 210, and address latch 211.

In the described embodiment, each of memory blocks 100–115 has its own memory array sequencer 205, access arbiter 206, refresh controller 207, external access control 208, transmission gates 209 and 210 and address latch 211. Address latch 211 includes a plurality of storage elements formed by cross-coupled inverters. For example, storage element 212, which includes cross-coupled inverters 213 and 214, stores one bit of the address value to be provided to memory array 201. In this embodiment, memory system 10 is organized as a multiple bank (block) system, wherein parallel operations can be performed in different memory banks or blocks simultaneously. This multiple bank memory structure is similar to that described in U.S. Pat. No. 6,028,804 entitled "Method And Apparatus For 1-T SRAM Compatible Memory" by the present inventor.

In another embodiment, a plurality of memory arrays (such as 201) are controlled by a single memory array sequencer 205, access arbiter 206, refresh controller 207, external access control 208, transmission gates 209 and 210, and address latch 211.

In the present embodiment, memory array 201 has 8K (8192) rows and 8K columns, yielding 64 megabits of memory. To access each memory location, external address signals EA[22:0] are provided to each memory block 100–115. It is understood that in other embodiments, memory array 201 can have a different size, thereby requiring other numbers of external address signals. Associated with each column within memory array 201 is a sense amplifier within sense amplifier circuit 202 which performs the data sensing, restore, and write operations. During each memory access, one row of memory array 201 is activated and the 8K memory cells of that row are connected to sense amplifiers 202 in each column. Sense amplifiers 202 are connected to I/O buffers 204 through multiplexer 203.

In the described embodiment, memory controller 120 drives the entire external address EA[22:0] onto the address bus at once. However, it is understood that the address may be multiplexed onto the address bus in separate clock cycle or clock phase portions, thereby reducing the required number of address signals. In the preferred embodiment, the address strobe ADS# and system clock CLK signaling is similar to the industry standard for synchronous static random access memory, set forth in Pentium Processor 3.3 v Pipeline BSRAM specification version 2.0, May 25, 1995, Intel.

An external access is performed as follows. External access control 208 is coupled to receive the signals write/ read WR#, address strobe ADS#, system clock CLK and external address EA[22:0] from memory controller 120. In response to these signals, external access control 208 generates an external access address EAA (which is equal to the external address EA[22:0]) and asserts an access pending enable signal EAPEN#.

To initiate a memory access to memory block 100, memory controller 120 asserts the address strobe signal ADS# low, asserts the chip select signal CS#[0] low, and provides the external address EA[22:0] on the external address bus. At the rising edge of the CLK signal, external access control 208 evaluates the state of the address strobe ADS# and chip select CS#[0] signals. If both signals are detected low, external access control 208 initiates an external access by asserting the external access pending signal EAPEN# low.

Access arbiter 206 is coupled to receive the external access pending signal EAPEN#. Upon detecting a low external access pending signal EAPEN#, access arbiter 206 asserts a high external address select signal EASEL. The high external address select signal EASEL causes transmission gate 210 to route the external access address EAA from external access control 208 to address latch 211. Address latch 211 provides the external access address EAA to memory array 201. Upon detecting the low state of the external access pending signal EAPEN#, access arbiter 206 asserts an external access signal EA#, which is provided to memory array sequencer 205. In response to the low asserted external access signal EA#, memory array sequencer 205 provides the DRAM control signals row address strobe RAS#, column address strobe CAS#, sense amplifier enable SEN# and pre-charge PRC# to memory array 201 for controlling array operations. A method of generating the signals RAS#, CAS#, SEN# and PRC# in a self-timed manner is described in U.S. Pat. No. 6,078,547 entitled "Method And Structure For Controlling Operation Of A DRAM Array," by the present inventor, which is hereby incorporated by reference. Generating the RAS#, CAS#, SEN# and PRC# signals in this manner enables a memory cycle to be completed in one clock cycle.

Each clock cycle without an external memory access is called an idle clock cycle. A memory refresh operation can be performed during an idle clock cycle by reading a row of memory array 201. Refresh controller 207 generates a refresh pending enable signal RFPEN#, which is provided to access arbiter 206, and a refresh address RFA, which is provided to transmission gate 209. Refresh controller 207 is coupled to receive a refresh acknowledge signal RFACK# from access arbiter 206. The refresh address RFA is the address of the row of memory array 201 to be refreshed. Memory array 201 is refreshed one row at a time, requiring 8K refreshes in the present embodiment. Refresh controller 207 generates refresh requests to ensure memory array 201 is properly refreshed. The timing of the refresh requests thus generated is determined from the system clock speed and the measured memory retention time of memory array 201. For a system clock speed of 100 megaHertz and a total memory retention time of 21.05 milliseconds, refresh controller 207 must generate a refresh request at least once every 2.56 microseconds. In general, the refresh period is chosen to ensure that the data retention time of memory array 201 is longer than the greatest possible time required to refresh every row of memory array 201.

In an alternate embodiment, especially when the entire memory system 10 is integrated in the same silicon substrate, a signal refresh timer 502 can be commonly shared by all of memory blocks 100–115.

Refresh controller 207 asserts the refresh pending enable signal RFPEN# low when a request to refresh a row of memory array 201 is pending. If the external access pending signal EAPEN# is high, indicating that no external accesses are pending, access arbiter 206 begins a refresh operation by driving the refresh acknowledge signal RFACK# low and the refresh address select signal RASEL high for one clock cycle. Transmission gate 209 receives the high refresh address select signal PASEL, and in response routes the refresh address RFA from refresh controller 207 to address latch 211. Address latch 211 provides the refresh address RFA to memory array 201.

The high state of the external access pending signal EAPEN# and the low state of the refresh pending enable signal RFPEN# also cause access arbiter 206 to assert low the refresh signal RF# provided to memory array sequencer 205. In response to the low asserted refresh signal RF#, memory array sequencer 205 provides the DRAM control signals row address strobe RAS#, sense amplifier enable SEN# and pre-charge PRC# to memory array 201 for controlling memory array 201 operations. As a result, a refresh access is performed to the row address identified by the refresh address RFA. The column address strobe CAS# is not activated during a refresh cycle. Access arbiter 206 asserts a logic low refresh acknowledge signal RFACK# to indicate to refresh controller 207 that a refresh operation has been performed. The timing of these operations is shown in FIG. 3.

Figure 3:
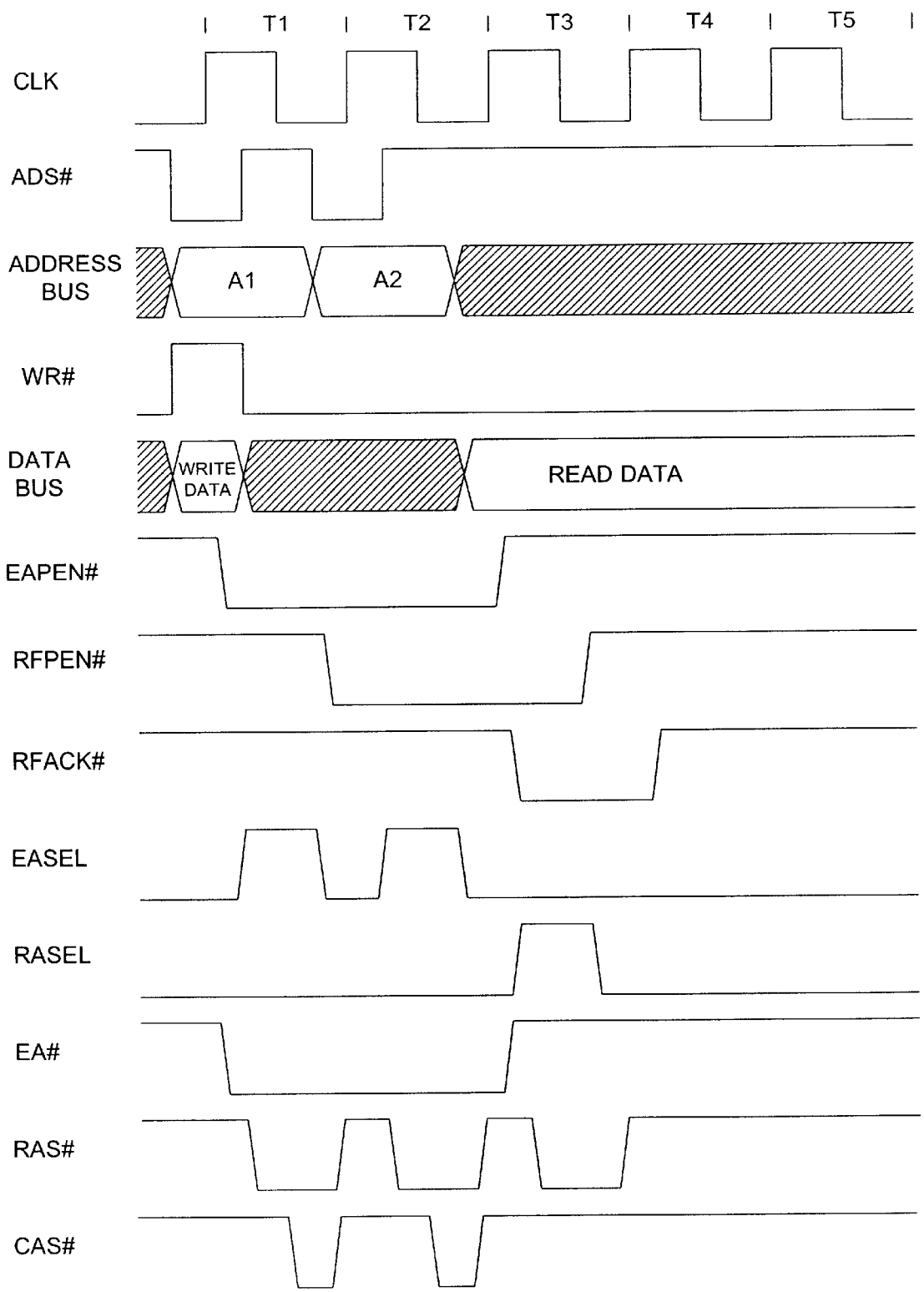
FIG. 3 is a waveform diagram of the timing of various signals during write, read and refresh operations in accordance with one embodiment of the present invention.

FIG. 3 is a waveform diagram of the timing of various signals in accordance with one embodiment of the present invention. For simplicity in the present description, the waveform diagram illustrates write, read and refresh operations in memory block 100 during three successive clock cycles T1–T3. Memory controller 120 completes a memory cycle in one clock period. Since a memory cycle takes only one clock period, memory block 100 will process one external memory access or memory row refresh in each clock cycle. Each clock cycle begins at the rising edge of the clock signal CLK.

To initiate an external write access, memory controller 120 asserts both the address strobe ADS# and the chip select CS#[0] signals low to access memory block 100. For this example, the chip select signal CS#[0] will be identical to the address strobe signal ADS#. Memory control 120 also provides a write address Al on the external address bus and a write data value on the external data bus. Memory controller 120 further provides a logic high write/read signal WR#, thereby indicating that the external access is a write access. At the rising edge of the system clock signal CLK for cycle T1, external access control 208 evaluates the state of the address strobe signal ADS# and the chip select signal CS#[0]. Upon detecting a low address strobe signal ADS#, a low chip select signal CS4[0], and a high write/read signal WR#, external access control 208 initiates an external write access. External access control 208 asserts the external access pending signal EAPEN# low. The low external access pending signal EAPEN# provided to access arbiter 206 causes access arbiter 206 to assert the external access signal EA# low. In response to the low asserted external access signal EA#, memory array sequencer 205 provides the DRAM control signals row address strobe RAS# and column address strobe CAS# to memory array 201 for controlling array write operations. Access arbiter 206 also provides a logic high external address select signal EASEL to transmission gate 210, thereby causing transmission gate 210 to route the write address A1 to address latch 211. Address latch 211 provides the write address A1 to memory array 201.

Prior to the rising edge of the system clock signal CLK, at the beginning of cycle T2, memory controller 120 again asserts the address strobe signal ADS# and the chip select signal CS#[0] low to access memory block 100. Memory controller 120 also provides a read address A2 on the external address bus. Memory controller 120 further provides a logic low write/read signal WR#, thereby indicating that the external access is a read access. At the rising edge of the system clock signal CLK for cycle T2, external access control 208 again evaluates the state of the address strobe signal ADS# and the chip select signal CS#[0]. Upon detecting a low address strobe signal ADS#, a low chip select signal CS#[0], and a low write/read signal WR#, external access control 208 initiates an external read access. External access control 208 continues to assert the external access pending signal EAPEN# low. The low external access pending signal EAPEN# provided to access arbiter 206 keeps the external access signal EA# low. In response to the low asserted external access signal EA#, memory array sequencer 205 provides the DRAM control signals row address strobe RAS# and column address strobe CAS# to memory array 201 for controlling array read operations. Access arbiter 206 also provides a logic high external address select signal EASEL for one half of a clock cycle to transmission gate 210, thereby causing transmission gate 210 to route the read address A2 to address latch 211. Address latch 211 provides the read address A2 to memory array 201.

During system clock CLK cycle T1, refresh controller 207 asserts the refresh pending signal RFPEN# low to indicate a refresh is required. As described above, an external access is also pending during cycle T2. Therefore two different requests are pending during cycle T2, resulting in an access collision. Access arbiter 206 acts to delay the refresh request in the case of such a collision until an idle memory cycle. An idle memory cycle is a memory cycle with no external memory access.

At the rising edge of the system clock signal CLK in cycle T3, external access control 208 again evaluates the state of the address strobe ADS# and the chip select CS#[0] signals. The high state of either the address strobe signal ADS# or the chip select signal CS#[0] indicates an idle memory cycle exists during cycle T3. Access arbiter 206 allows the refresh to occur in this idle memory cycle by deasserting the external address signal EA# high, asserting the refresh signal RF# low, and providing a high refresh address select signal RASEL. The refresh address select signal RASEL is driven high for half of a clock cycle. Under these conditions, transmission gate 209 routes the refresh address RFA through address latch 211 to memory array 201 and memory array sequencer 205 provides the row address strobe signal RAS# to refresh memory array 201. As a result, a refresh access is performed to the refresh address RFA generated by refresh controller 207.

Figure 4:
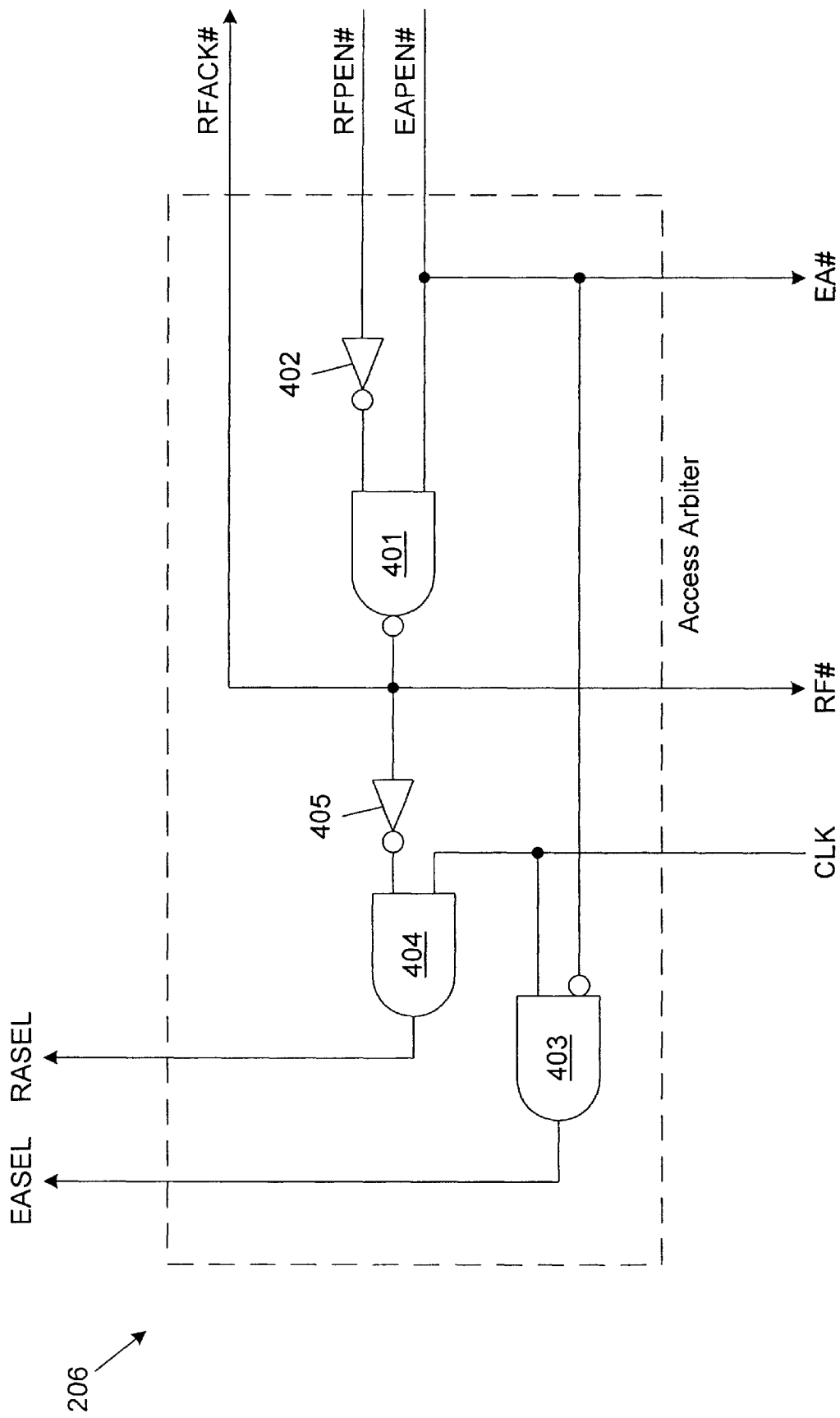
FIG. 4 is a schematic diagram of an access arbiter in accordance with one embodiment of the present invention.

FIG. 4 illustrates access arbiter 206 in accordance with one embodiment of the invention. In the present embodiment, access arbiter 206 includes two input NAND gate 401, two input AND gates 403 and 404, and inverters 402 and 405. The refresh pending signal RFPEN# is provided to the first input terminal of NAND gate 401 through inverter 402. The external access pending signal EAPEN# is provided to the second input terminal of NAND gate 401, the inverting input terminal of AND gate 403, and also to memory array sequencer 205 as the external address signal EA#. The system clock CLK is provided to the non-inverting input terminal of AND gate 403. The output signal of AND gate 403 is provided to transmission gate 210 as the external address select signal EASEL. The output signal of NAND gate 401 provides the refresh RF# and refresh acknowledge RFACK# signals to memory array sequencer 205 and refresh controller 207, respectively. Additionally, the output signal of NAND gate 401 is provided to the first input terminal of AND gate 404 through inverter 405. The system clock CLK is provided to the second input terminal of AND gate 404. The output signal of AND gate 404 is provided to transmission gate 209 as the refresh address select signal RASEL.

Access arbiter 206 functions to prevent refresh accesses except in the absence of a pending external access. In the case of a conflict of access between a pending external access and a pending refresh access, the external access always has priority. By giving the external accesses priority, the external accesses are not delayed by refresh accesses. If external access pending signal EAPEN# is low, indicating an external memory access in this cycle, the output signal of NAND gate 401 will be high, regardless of the state of the refresh pending signal RFPEN#. External address signal EA# is asserted low and refresh signal RF# is deasserted high, indicating an external memory access. Refresh acknowledge signal RFACK# is deasserted high, indicating that this memory cycle is not used for refresh. External address select signal EASEL is asserted high, moving the external access address EAA through address latch 211 on to the memory array 201 address bus.

When there is no pending external access, EAPEN# is deasserted high, allowing the refresh pending signal RFPEN# to drive the output signal of NAND gate 401. If there is no refresh pending, refresh pending signal RFPEN# will be deasserted high, providing a low signal from the output terminal of inverter 402 to the input terminal of NAND gate 401. The output signal of NAND gate 401 is therefore high, keeping refresh acknowledge signal RFACK# high to indicate that this memory cycle is not used for refresh. If there is a pending refresh, refresh acknowledge signal RFPEN# will be low, providing a high output signal from inverter 402 to the input terminal of NAND gate 401. This high signal and the high state of external access pending signal EAPEN# force the output signal of NAND gate 401 low. The output signal of NAND gate 401 drives the signals refresh RF# and refresh acknowledge RFACK# low. Additionally, the output signal of NAND gate 401 passes through inverter 405 and drives the output of AND gate 404 high when the system clock CLK goes high. Therefore, memory array sequencer 205 is provided with a low refresh signal RF#. Transmission gate 209 is provided with a high refresh address select signal RASEL, providing the refresh address RFA to address latch 211. The refresh acknowledge signal RFACK# is asserted low and provided to refresh controller 207, indicating the use of this clock cycle for a refresh.

Figure 5:
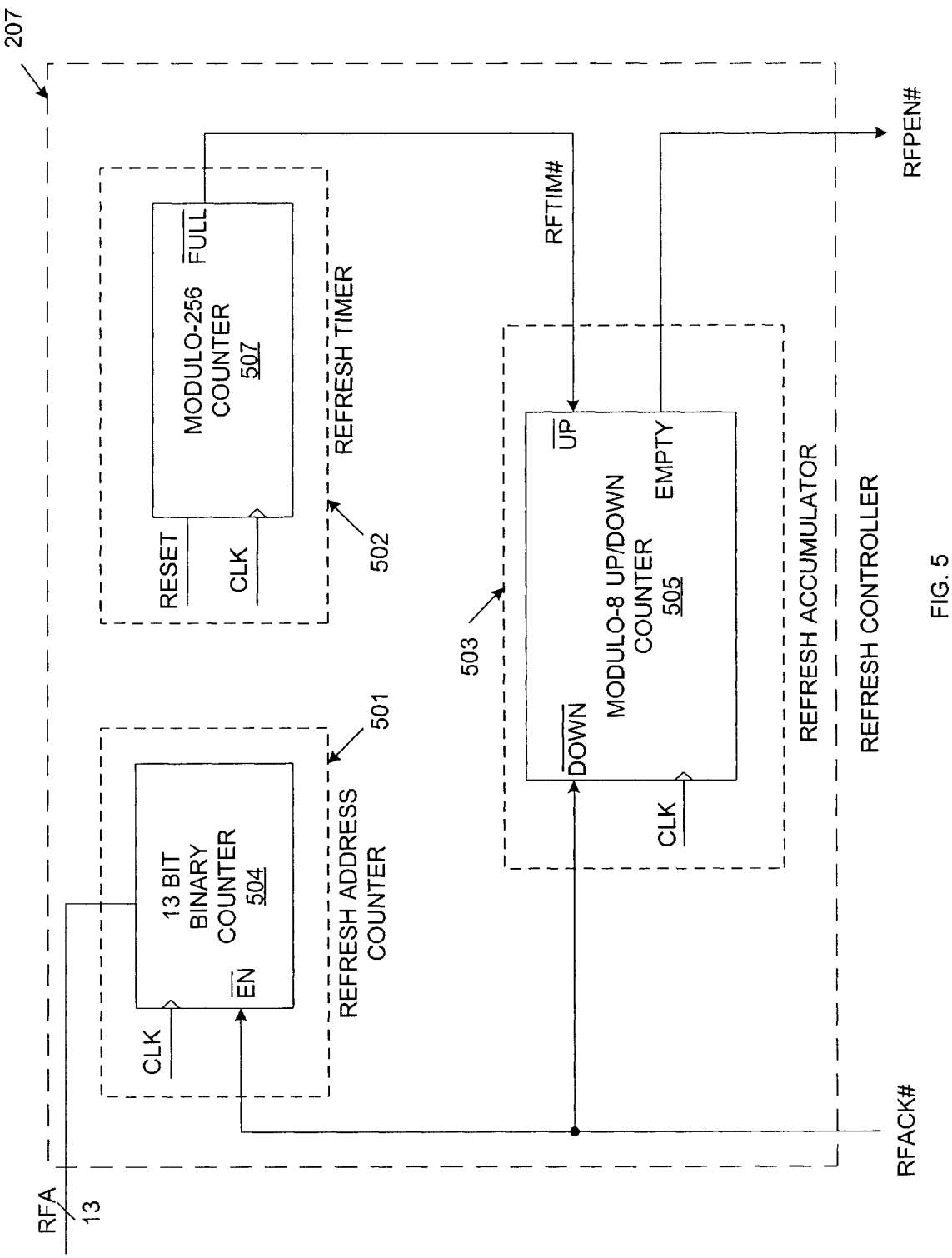
FIG. 5 is a schematic diagram of a refresh controller in accordance with one embodiment of the present invention.

FIG. 5 is a block diagram showing refresh controller 207 in accordance with one embodiment of the present invention. Refresh controller 207 includes refresh address counter 501, refresh timer 502 and refresh accumulator 503. Refresh address counter 501 includes thirteen bit binary counter 504 coupled to receive both the refresh acknowledge signal RFACK# and the system clock signal CLK. In response, binary counter 504 provides the current refresh address RFA on a thirteen bit address bus to transmission gate 209. The size of the address bus is chosen to access each row of memory array 201. The system clock CLK is provided to synchronize operations of binary counter 504. Refresh acknowledge signal RFACK# is high unless a memory refresh has occurred, asserting the refresh acknowledge signal RFACK# low for one clock cycle. Each low refresh acknowledge signal RFACK# increments binary counter 504, sequentially moving through the address of each memory row in memory array 201.

Refresh timer 502 includes modulo-256 counter 507. Counter 507 is coupled to provide the refresh time signal RFTIM# to refresh accumulator 503. In another embodiment, where the entire memory system 10 is integrated in a single substrate, one refresh timer 507 can be used to drive a common RFTIM# signal, which is connected in parallel to the refresh controllers of all of memory blocks 100–115. System RESET and clock signal CLK are provided to initialize and synchronize operations of counter 507, respectively. Upon initial power up, counter 507 is initialized to zero by the system RESET command. The counter then increments once each clock cycle up to a full count of 255. The next increment of counter 507 asserts refresh time signal RFTIM# low for one clock cycle and rolls the count over to zero. Counter 507 counts 1 at the next CLK cycle, cycling again through the count. In the present embodiment, the refresh period thus tracked by counter 507 is 256 counts. This count of 256 divided by a 100 megaHertz clock asserts refresh time signal RFTIM# low each 2.56 microseconds. Although counter 507 is described as a modulo-256 counter in the present embodiment, it is understood that other methods of tracking a time period may be present in other embodiments.

Refresh accumulator 503 includes a modulo-8 up/down counter 505 that is coupled to receive the refresh acknowledge signal RFACK#, the refresh time signal RFTIM#, and the system clock signal CLK. A non-zero count for counter 505 asserts the refresh pending signal RFPEN# low. The system clock signal CLK is provided to synchronize counter operations.

In the present embodiment, counter 505 is a modulo-8 up/down counter. Each low refresh acknowledge signal RFACK# decrements the count by one, and each low refresh time signal RFTIM# increments the count by one. If the count kept by counter 505 is non-zero, the refresh pending RFPEN# output signal from counter 505 will be low, indicating to access arbiter 206 that at least one memory location within memory array 201 is ready for refresh. Refresh pending signal RFPEN# will remain low until enough refresh acknowledge signals RFACK# decrement the count of counter 505 to zero. Counter 505 is full at a count of 8. Therefore, refresh cycles could be lost if counter 505 reaches a full count and there are no subsequent refresh accesses performed before counter 507 asserts another low refresh time signal RFTIM#.

The present embodiment utilizes a modulo-8 refresh accumulator 503, which allows up to eight refresh time signals RFTIM# to be accumulated. Because a refresh time signal RFTIM# is generated every 2.56 microseconds, refresh accumulator 503 is capable of accumulating refresh requests for a 20.48 microsecond period. This 20.48 microsecond period is termed a proper refresh period. The proper refresh period is defined as the period of time that memory array 201 can be in constant external memory access without requiring a refresh operation. Although the present embodiment uses a modulo-8 accumulator, an accumulator capable of a different count can be used to adjust the duration of the proper refresh period. In the simplest alternate embodiment, an accumulator of one bit can be used, limiting the proper refresh period to be the individual period, which is 2.56 microseconds for a clock frequency of 100 megaHertz.

In summary, memory block 100 incorporates refresh timer 502 to generate periodic refresh requests, refresh address counter 501 to supply the address of the row to be refreshed, refresh accumulator 503 to store a number of refresh requests, and access arbiter 206 to defer the refresh operation when the memory is handling external access.

Memory block 100 performs refresh operations during clock cycles where there is no external access requested. To make sure that memory blocks 100–115 are refreshed properly, memory controller 120 needs to make sure that each of memory blocks 100–115 in the system has enough idle cycles in each proper refresh period to prevent the associated refresh accumulator 503 in each of these blocks from overflowing. As described above, refresh accumulator 503 will store up to 8 refresh requests. Consequently, 8 idle cycles are required during a proper refresh period of 20.48 microseconds.

On average, one refresh access should be performed every 256 clock cycles. One refresh operation therefore occupies $\frac{1}{256}$ or 0.4% of the available system cycles or bandwidth. In a typical system, this one idle cycle typically will be available without any intervention by memory controller 120, as is noted in U.S. Pat. No. 6,028,804 entitled "Method And Apparatus For 1-T SRAM Compatible memory," by the present inventor. This is especially true in a configuration such as is described in U.S. Pat. No. 6,075,740 entitled "Method And Apparatus For Increasing The Time Available For Refresh For 1-T SRAM Compatible Devices," by the present inventor. Additionally, the average system bandwidth needed for refresh operations decreases significantly with multiple memory devices as does the probability that one memory device is occupied with external access for a period longer than the proper refresh period.

Nevertheless, there is still a finite probability that a memory block may not be refreshed due to continuous memory access to the memory block for a duration greater than the proper refresh period. To ensure that memory blocks 100–115 are properly refreshed under all conditions, memory controller 120 must keep track of the number of idle cycles occurring within the proper refresh period, and suspend external memory access if the number of idle cycles is insufficient to allow adequate time for refresh operations.

Memory controller 120 controls external access to memory blocks 100–115 to ensure that each memory block has adequate time for refresh. It is possible that the external access requests will occupy a memory block for an entire proper refresh period. In such an event, fewer than the 8 required idle cycles for refresh are present during the proper refresh period. Under these conditions, memory controller 120 will delay external access until the required memory refresh operations are performed. Stated another way, memory controller 120 will force the required number of idle cycles to be present during a proper refresh period.

Figure 6:
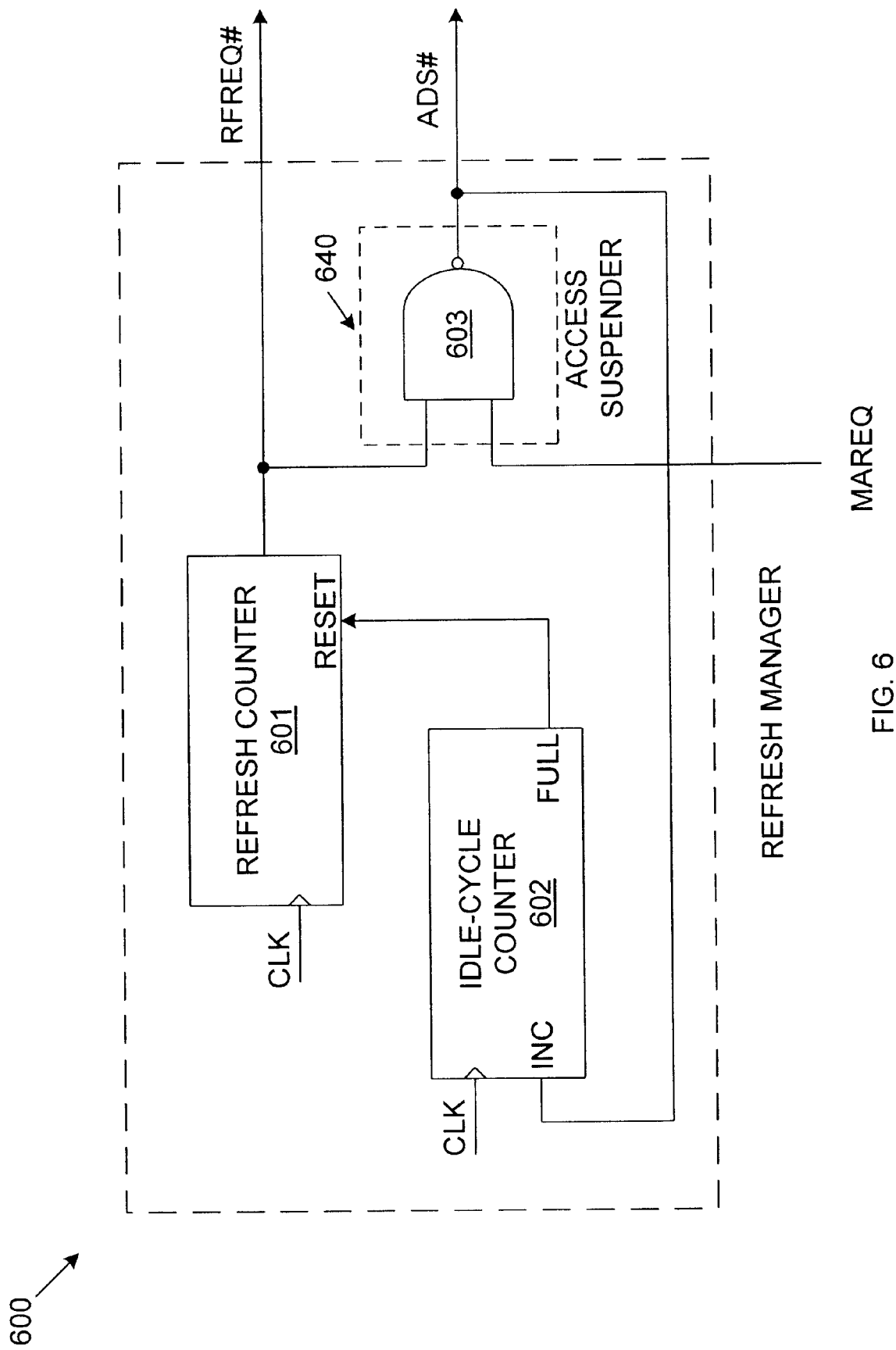
FIG. 6 is a schematic diagram of a refresh manager for controlling one group of memory blocks in accordance with one embodiment of the present invention.
Figure 7:
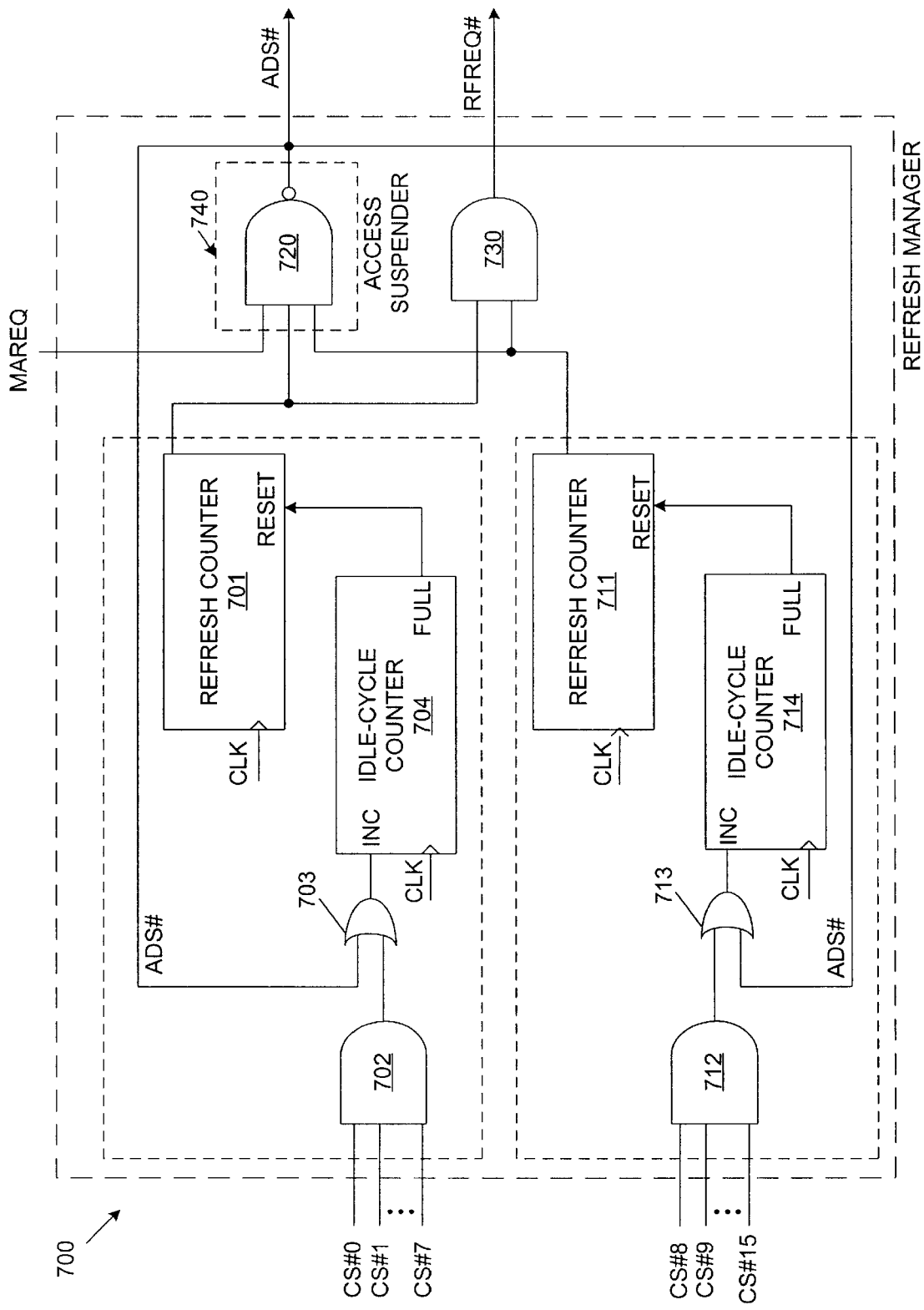
FIG. 7 is a schematic diagram of a refresh manager for controlling two groups of memory blocks in accordance with another embodiment of the present invention.
Figure 8:
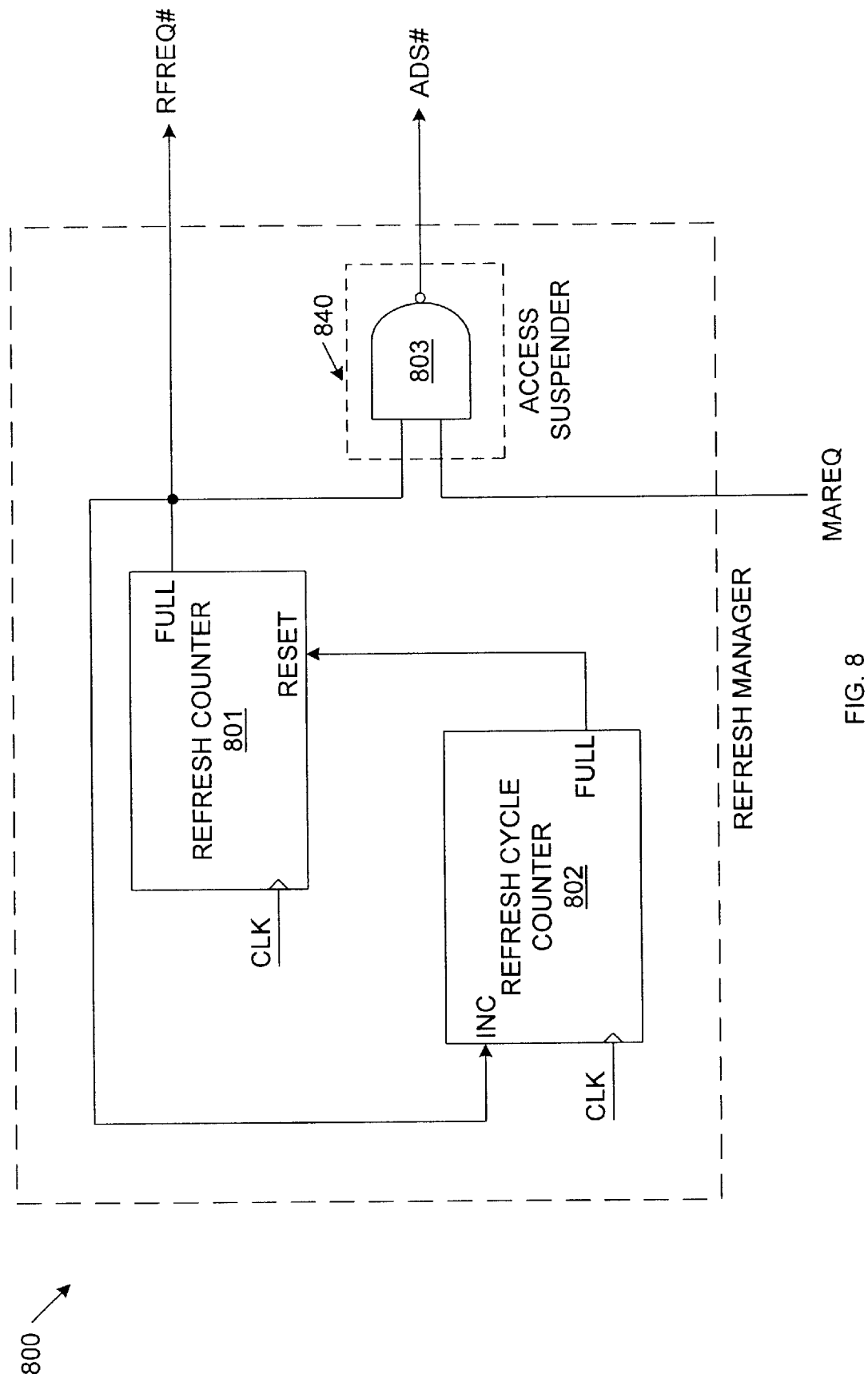
FIG. 8 is a schematic diagram of a refresh manager for forcing idle cycles into a memory system in accordance with another embodiment of the present invention.

FIGS. 6, 7 and 8 are schematic diagrams of refresh managers 600, 700, and 800, respectively, in accordance with various embodiments of the present invention. Refresh managers 600, 700 and 800 are each located in memory controller 120. Refresh managers 600, 700 and 800 generate a refresh required signal RFREQ# as well as the address strobe signal ADS#. The refresh required signal RFREQ# is returned to accessing devices (not shown) that access memory system 10. The accessing devices may or may not be located in the same chip as memory controller 120. The refresh required signal RFREQ# is asserted low to inform the accessing devices that additional accesses should be deferred. The address strobe signal ADS# indicates the presence of an idle cycle when in a logic high state, as described above.

The refresh manager portion of memory controller 120 contains a mechanism that ensures that the number of idle memory cycles within a proper refresh period equals or exceeds the number of refresh cycles required by each of memory blocks 100–115. It is noted that this mechanism does not require external communication between memory blocks 100–115 and memory controller 120. One advantage of this scheme is that memory blocks 100–115 can be used in place of static random access memory SRAM devices which use the same interface without any change of the control mechanisms in memory controller 120.

FIG. 6 is a schematic diagram of refresh manager 600, which includes refresh counter 601, idle-cycle counter 602 and access suspender 640. Access suspender 640 includes NAND gate 603, which provides address strobe signal ADS#. The system clock CLK is provided to synchronize operations. Refresh counter 601 counts from zero to an amount of time equal to the proper refresh period for memory array 201. In the present embodiment, refresh counter 601 counts to the maximum of refresh accumulator 503 and modulo-256 counter 507, which is 8 times 2.56 microseconds, equaling the 20.48 microsecond proper refresh period counted by refresh accumulator 503. The output refresh required RFREQ# signal of refresh counter 601 remains high unless the maximum refresh period has been counted. The refresh required signal RFREQ# is then asserted low, delaying memory access until refresh counter 601 is reset by idle-cycle counter 602.

Idle-cycle counter 602 is a three bit counter, and increments once each time an idle cycle is available for refresh. Refresh counter 601 is reset to count from zero each time idle-cycle counter 602 reaches the 8 idle cycles required in the proper refresh period for memory blocks 100–115 refresh. Therefore, if idle-cycle counter 602 reaches the full count of eight before refresh counter 601 counts the proper refresh period, a high signal is asserted at the RESET for refresh counter 601. This high RESET causes the refresh counter 601 to begin counting the proper refresh period from zero, keeping the address strobe signal ADS# high and allowing uninterrupted memory access.

Access suspender 640, which includes NAND gate 603, is coupled to receive the refresh required signal RFREQ# and the memory access required signal MAREQ. The memory access required signal MAREQ is asserted high when a memory request is received by memory controller 120 from an accessing device. Accessing devices of memory controller 120 can be a CPU, an I/O processor, a graphics processor or others. These possible accessing devices of memory controller 120 are not shown. If refresh counter 601 has not yet counted to the maximum refresh period, the refresh required signal RFREQ# will be high. Under these conditions, the output signal of access suspender 640 is dependent on the state of the memory access required signal MAREQ. An external request for memory access asserts the memory access required signal MAREQ high, resulting in a low output signal for the address strobe signal ADS# from access suspender 640. The low state of the address strobe signal ADS# indicates a memory access is pending. In the absence of a memory access, the memory access required signal MAREQ will be low, asserting the output signal address strobe ADS# of access suspender 640 high. The high address strobe signal ADS# indicates that an idle memory cycle exists for possible memory refresh. This address strobe signal ADS# also increments idle-cycle counter 602 by one count.

If fewer than eight idle cycles have occurred within the proper refresh period, refresh manager 600 will delay further memory access until all pending memory refreshes are completed. When refresh counter 601 has counted to the proper refresh period without having the required idle cycles for refresh, the output refresh required signal RFREQ# is asserted low. The refresh required signal RFREQ# is sent back to the accessing devices to delay memory access. The low state of the refresh required signal RFREQ# also forces the output signal address strobe ADS# of access suspender 640 high, indicating an idle memory cycle is available for memory refresh. This low address strobe signal ADS# also increments idle-cycle counter 602. The refresh required signal RFREQ# remains low until refresh counter 601 is reset, thus the address strobe signal ADS# will remain high until idle-cycle counter 602 has reached the full count of the required idle memory cycles. When idle-cycle counter 602 reaches a full count, its output signal goes high for one clock cycle to reset refresh counter 601. The count of refresh counter 601 automatically wraps to zero and resumes counting, asserting the refresh required signal RFREQ# high and resuming normal memory access.

Idle-cycle counter 602 counts to the maximum number of refresh cycles required among all memory blocks 100–115. In the present embodiment, memory blocks 100–115 are identical, and require 8 idle cycles within a proper refresh period. In another embodiment, one memory block may require 10 refreshes and another memory block may require 5 refreshes within a proper refresh period. In such an embodiment, the idle cycle counter would need to count to 10 to ensure both memory blocks were refreshed properly within the proper refresh period.

The simple refresh manager described in FIG. 6 manages the refresh of all memory devices in the system in a unified manner. It does not distinguish between individual memory devices in the system by treating them all together as one single memory device.

FIG. 7 is a schematic diagram of refresh manager 700 in accordance with another embodiment of the invention. Refresh manager 700 takes advantage of the fact that when one of memory devices 100–107 is being accessed, the other group of memory devices 108–115 can carry out a memory refresh. Memory blocks 100–115 are separated into two groups of equal size. Each group of memory blocks is managed by a separate refresh counter and idle-cycle counter. Refresh counters 701 and 711 are identical to refresh counter 601. Idle-cycle counters 704 and 714 are identical to idle-cycle counter 602

Refresh manager 700 of FIG. 7 includes refresh counters 701 and 711, AND gates 702 and 712, OR gates 703 and 713, idle-cycle counters 704 and 714, AND gate 730 and access suspender 740. Access suspender 740 includes NAND gate 720.

AND gate 702 is coupled to receive chip select signals CS#[0:7]. If any one of memory blocks 100–107 is carrying out an external access, one of the chip select signals CS# [0:7] will be low, driving the output signal of AND gate 702 low. OR gate 703 is coupled to receive the address strobe signal ADS# and the output signal of AND gate 702. The address strobe signal ADS# is asserted low when an external access is pending, and deasserted high when an idle cycle exists. A low signal provided by AND gate 702 will force the output signal of OR gate 703 to follow the address strobe signal ADS#, therefore incrementing idle-cycle counter 704 if there is no external access pending. When the required number of idle cycles has been counted, idle-cycle counter 704 will assert its output signal high for one clock cycle to reset counter 701.

If one of the chip select signals CS#[0:7] is asserted low, indicating a memory access to one of memory blocks 100–107, then the other group of memory blocks 108–115 will be idle for that cycle. Chip select signals CS#[8:15] will be high, indicating a lack of memory access to memory blocks 108–115, and forcing the output signal of AND gate 712 high. This high output signal of AND gate 712 forces the output signal of OR gate 713 high without regard to the address strobe signal ADS#, incrementing idle-cycle counter 714.

Refresh counters 701 and 711 count up to the proper refresh period. If either reaches the maximum count, the output signal of that refresh counter goes low, indicating a need to force idle cycles to refresh one of the memory blocks. AND gate 730 is coupled to receive the output signal of each counter 701 and 711, and provides the refresh required signal RFREQ#. Additionally, access suspender 740 is coupled to receive the output signal of each refresh counter 701 and 711, and the memory request signal MAREQ. If either refresh counter 701 or 711 asserts a low output signal, the output signal of NAND gate 720 is forced high and the output signal of AND gate 730 is forced low. This forces the address strobe signal ADS# high and the refresh required signal RFREQ# low. The high address strobe signal ADS# forces an idle cycle into memory system 10, and indicates an idle cycle is currently available for memory refresh. The low refresh required signal RFREQ# indicates to the accessing devices that memory access requests should be delayed. Refresh counters 701 and 711 are reset to zero counts in response to full counts from idle-cycle counters 704 and 714, respectively.

When neither refresh counter 701 nor 711 is full, these refresh counters provide logic high output signals. In response, AND gate 730 provides a logic high refresh required signal RFREQ#. As described above, a logic high refresh required signal RFREQ# allows external access to be performed without delay. The address strobe signal ADS# provided by access suspender 740 is asserted low when a memory access is pending, and is deasserted high during an idle cycle.

Although the present embodiment shows two groups of eight memory blocks, it is understood that any number of memory blocks may be grouped in any quantity. For example, in another embodiment, three blocks may be present in one group and thirteen blocks present in another group. Appropriate modification must be made to access suspender 740. The present embodiment also may be extended to manage memory devices capable of multi-bank operations. In particular, one bank of the device engages in external access while the other performs refresh. In such a system, the different banks of the memory device are managed by separate sets of refresh managers.

FIG. 8 is a schematic diagram of refresh manager 800 of memory controller 120 in accordance with another embodiment of the present invention. In this embodiment, refresh manager 800 includes refresh counter 801, refresh cycle counter 802 and access suspender 840. Access suspender 840 includes NAND gate 803. Refresh manager 800 functions by forcing a fixed number of idle memory cycles into memory system 10 through access suspender 840 every time refresh counter 801 reaches a full count, despite the number of idle cycles that have occurred.

Refresh counter 801 counts to a proper refresh period. When a full count is reached, the output signal refresh required RFREQ# is asserted low. The low asserted refresh required signal RFREQ# suspends external memory access and asserts the output address strobe signal ADS# from access suspender 840 high, thereby inserting idle memory cycles. Refresh cycle counter 802 counts once for each clock cycle the refresh required signal RFREQ# remains low until refresh cycle counter 802 reaches a full count. In the described embodiment, refresh cycle counter 802 counts to eight, thereby inserting eight idle cycles for refresh. The output signal of refresh cycle counter 802 is then driven high, resetting refresh counter 801. Refresh counter 801 begins counting from zero, deasserting the output signal refresh required RFREQ# high and again allowing access suspender 840 to be directly responsive to the memory access required signal MAREQ.

In the present embodiment, access suspenders 603, 720 and 803 have been shown to generate the address strobe signal ADS# to suspend external memory access, thereby inserting idle cycles for memory refresh. In another embodiment, access suspenders 603, 720 and 803 can be configured to generate the chip select signals CS#[15:0] to suspend external memory access.

Figure 9:
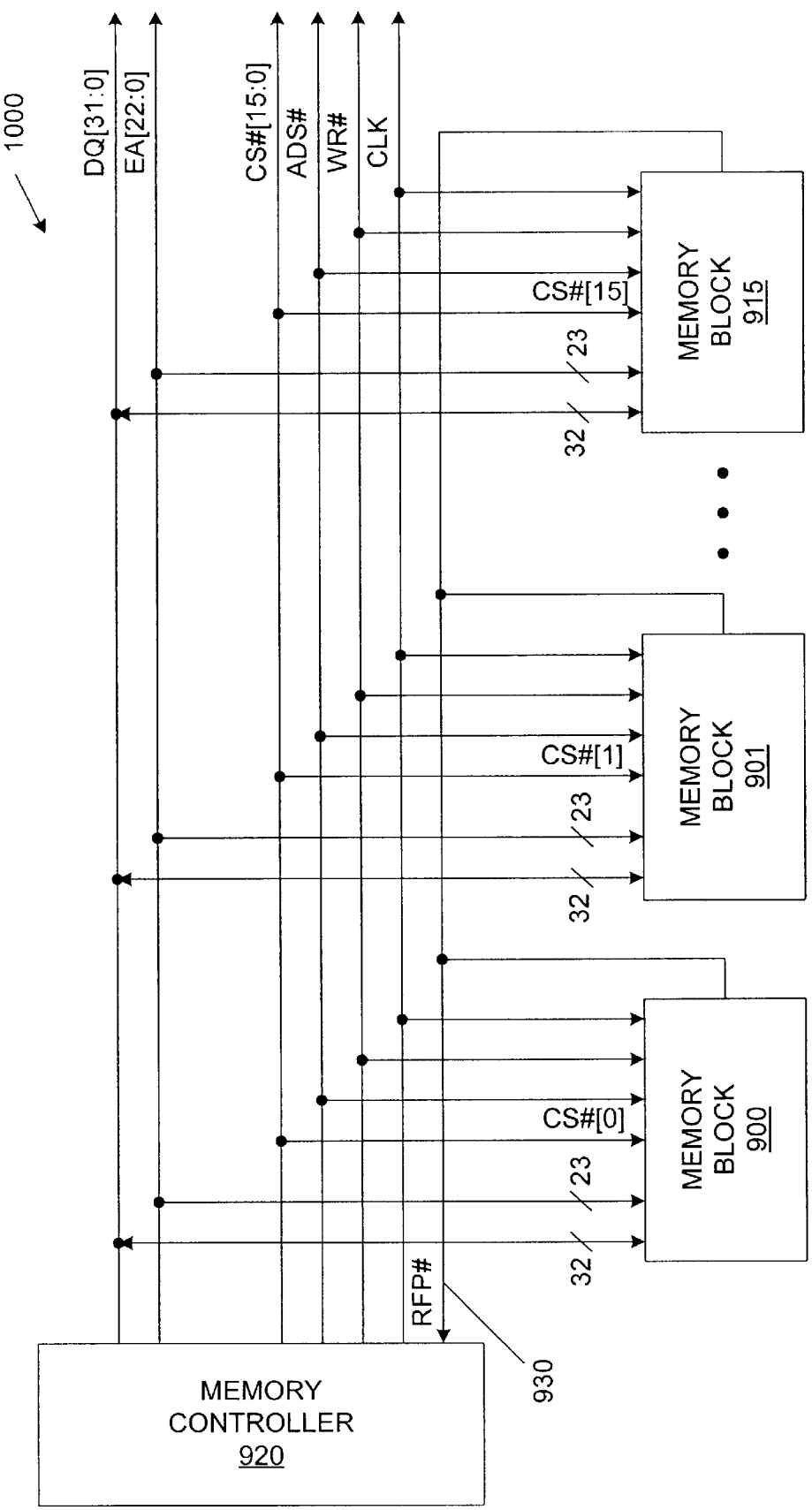
FIG. 9 is a block diagram of a memory system in accordance with another embodiment of the present invention.

FIG. 9 is a block diagram of memory system 1000 in accordance with another embodiment of the present invention. Memory system 1000 includes memory blocks 900–915 and memory controller 920. Memory controller 920 can be part of a processor or system logic. Memory blocks 900–915 are similar to memory blocks 100–115 (FIG. 1), with the differences being described below. In addition to the above-described signals used by memory system 10 (FIG. 1), memory system 1000 includes a refresh pending signal RFP#, which is provided to memory controller 920 on line 930. As described in more detail below, the RFP# signal is pulled up to a logic "1" value, unless one or more of memory blocks 900–915 pulls this signal down to a logic "0" value. Each of memory blocks 900–915 is configured to pull down the RFP# signal if the memory block does not receive an idle cycle during a refresh period. If the RFP# signal is pulled down at the end of a refresh period, memory controller 920 forces an idle cycle.

Figure 10:
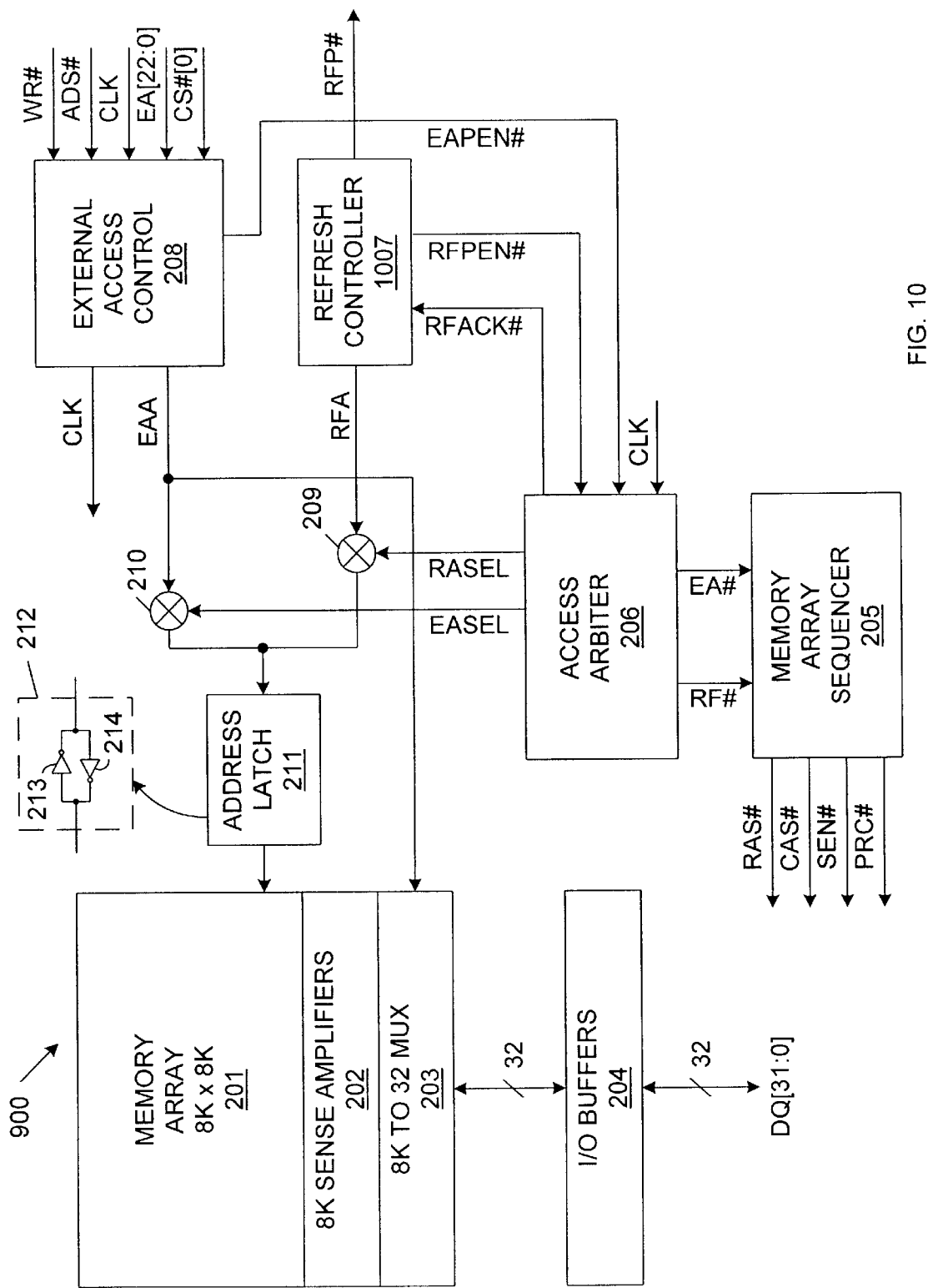
FIG. 10 is a block diagram of a memory block of the memory system of FIG. 9 in accordance with one embodiment of the present invention.

FIG. 10 is a block diagram of memory block 900 in accordance with one embodiment of the present invention. Because memory block 900 (FIG. 10) is similar to memory block 100 (FIG. 2), similar elements in FIGS. 2 and 10 are labeled with similar reference numbers. Thus, memory block 900 includes memory array 201, sense amplifiers 202, multiplexer 203, I/O buffers 204, memory array sequencer 205, access arbiter 206, external access control 208, transmission gates 209 and 210, and address latch 211. In addition, memory block 900 includes refresh controller 1007 (which replaces refresh controller 207 of memory block lob).

Figure 11:
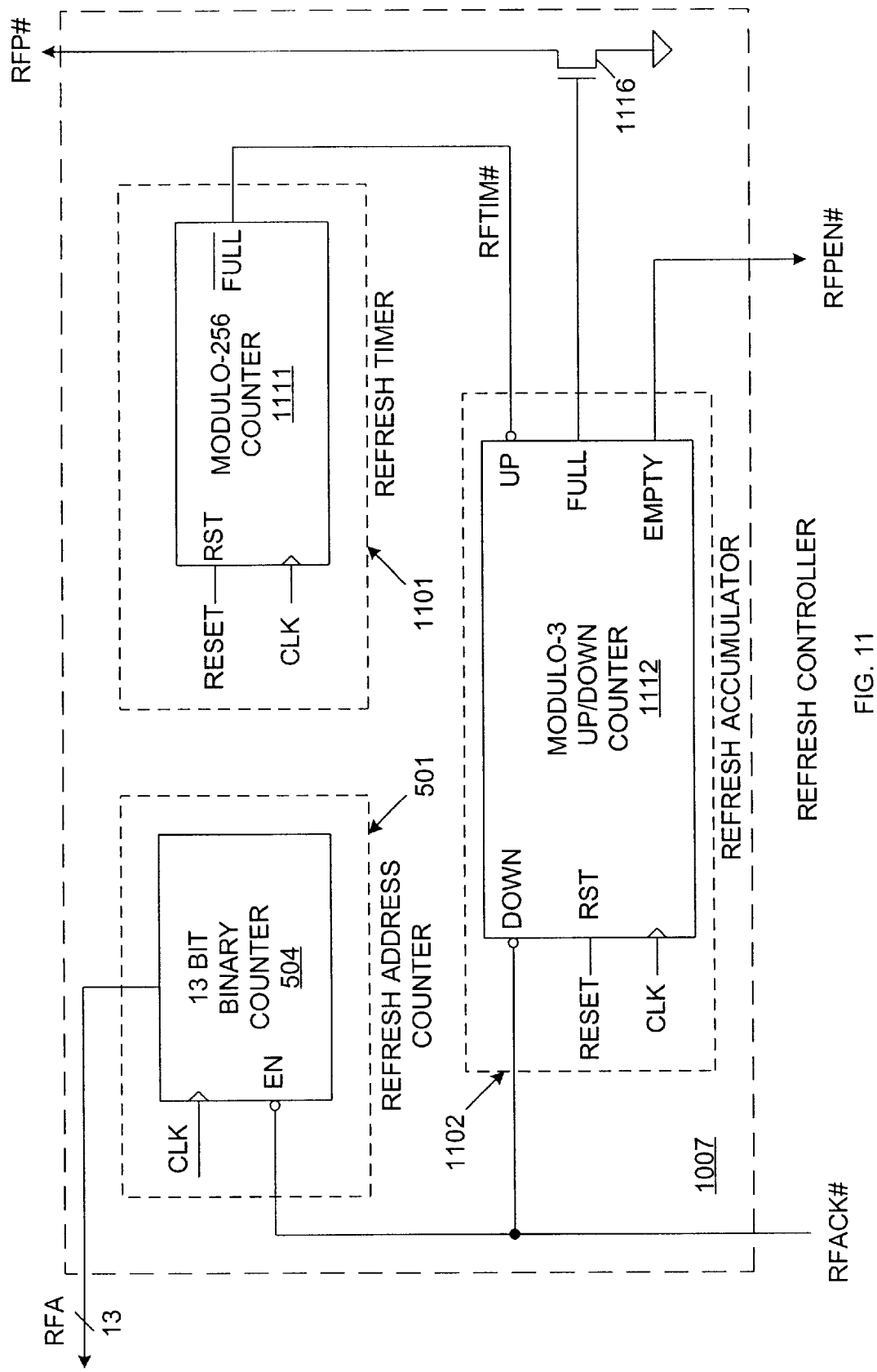
FIG. 11 is a block diagram of a refresh controller for use in the memory block of FIG. 10 in accordance with one embodiment of the present invention.

FIG. 11 is a block diagram of refresh controller 1007 in accordance with one embodiment of the present invention. Refresh controller 1007 includes refresh address counter 501, which has been described above in connection with FIG. 5. Refresh controller 1007 also includes refresh timer 1101, refresh detector 1102, and n-channel pull-down transistor 1116.

Refresh timer 1101 includes modulo-256 counter 1111. Counter 1111, which is incremented by the CLK signal, includes a reset terminal (RST) coupled to receive the system RESET signal. Counter 1111 provides a logic low refresh timing output signal (RFTIM#) upon reaching a full count. When counter 1111 does not have a full count, this counter provides a logic high refresh timing signal (RFTIM#).

In an alternate embodiment, one refresh timer 1101 can be shared by all of memory blocks 900–915. In this case, the output signal RFTIM# is broadcast to all of memory blocks 900–915.

Refresh accumulator 1102 includes modulo-3 up/down counter 1112, which includes counts 0, 1 and 2. The DOWN terminal of counter 1112 is coupled to receive the inverse of the RFACK# signal. The reset terminal of counter 1112 is coupled to receive the system RESET signal. The UP terminal of counter 1112 is coupled to receive the inverse of the RFTIM# signal. The EMPTY output terminal of counter 1112 provides the RFPEN# signal. The FULL output terminal of counter 1112 is coupled to the gate of pull-down transistor 1116. The source of transistor 1116 is coupled to ground, and the drain of transistor 1116 is coupled to RFP# line 930.

Figure 12:
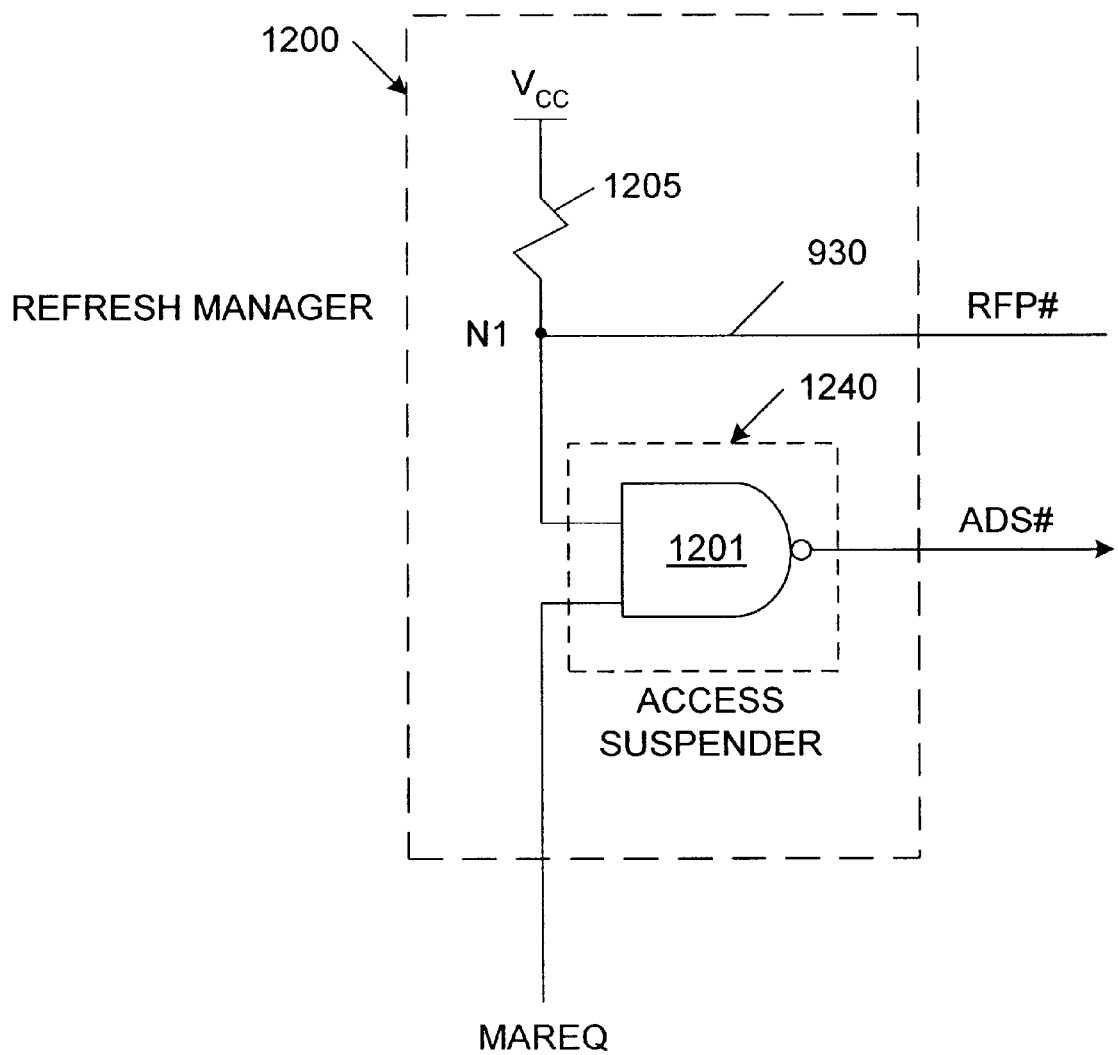
FIG. 12 is a schematic diagram of a refresh manager for use with the refresh controller of FIG. 11 in accordance with one embodiment of the present invention.

FIG. 12 is a schematic diagram of refresh manager 1200 in accordance with the present embodiment. Refresh manager 1200 includes access suspender 1240 (i.e., NAND gate 1201) and resistor 1205. Resistor 1205 is coupled between node N1 and the $V_{cc}$ supply voltage. Node N1 is further coupled to RFP# line 930 and to an input terminal of NAND gate 1201. If the n-channel pull-down transistor 1116 in any of memory blocks 900–915 is turned on, the RFP# signal on line 930 is pulled down to a logic low value. If the n-channel pull down transistor 1116 is not turned on in any of memory blocks 900–915, then the RFP# signal on line 930 is pulled up to a logic high value through resistor 1205. The other input terminal of NAND gate 1201 is coupled to receive the MAREQ signal. NAND gate 1201 provides the ADS# signal in response to the RFP# and MAREQ signals.

Refresh controller 1007 and refresh manager 1200 operate as follows. System RESET and clock CLK signals are provided to initialize and synchronize operations of counter 1111, respectively. Upon initial power up, counter 1111 is initialized to zero by the system RESET command. In addition, up/down counter 1112 is reset to a count of "1". As a result, the EMPTY signal has a logic "0" value and the FULL signal has a count of "0". Counter 1111 then increments once each clock cycle up to a full count of 255. When counter 1111 reaches a full count, the RFTIM# signal is asserted low, thereby indicating the last cycle of a refresh period. At this time, one of two conditions will exist.

In the first condition, an idle cycle occurs in memory block 900 (and each of memory blocks 901–915) during the refresh period (i.e., before the RFTIM# signal is asserted low). In this case, a refresh operation is performed during the idle cycle, such that the refresh acknowledge signal RFACK# is asserted low. The low RFACK# signal causes up/down counter 1112 to be decremented to a count of "0", thereby causing the EMPTY signal (i.e., the RFPEN# signal) to be set to a logic "1" value. The logic high RFPEN# signal prevents additional refresh operations from being performed during the refresh period. The FULL signal remains at a logic low value, thereby causing pull-down transistor 1116 to be turned off, such that transistor 1116 does not pull down the RFP# signal. Thus, memory block 900 does not request a refresh cycle during the first condition, because a refresh operation was performed during the refresh period.

In the second condition, no idle cycle occurs in memory block 900 during the refresh period (i.e., the ADS# and CS#[0] signals are continuously asserted low during the entire refresh period). In this case, a no refresh operation is performed by memory block 900, and the refresh acknowledge signal RFACK# remains de-asserted high. Consequently, the EMPTY output signal of up/down counter 1112 continues to provide a logic low RFPEN# signal. When counter 1111 becomes full and asserts a logic low RFTIM# signal, up/down counter 1112 is incremented to a count of "2". In response, up/down counter 1112 asserts a logic high FULL signal, which is provided to the gate of pull-down transistor 1116. In response, pull-down transistor 1116 turns on, thereby pulling the RFP# signal down to a logic low level. The logic low RFP# signal applied to NAND gate 1201 (FIG. 12) causes the ADS# signal to be de-asserted high. The logic high ADS# signal forces an idle cycle in memory block 900.

At the rising edge of the next clock cycle, the RFTIM# signal has a logic "1" value and the RFACK# signal has a logic "0" value. In response, up/down counter 1112 decrements from a count of "2" to a count of "1", thereby causing the FULL output signal to go low. The low FULL signal causes pull-down transistor to turn off. At this time, the process begins again for another refresh period. In this manner, one row of each memory array is refreshed once every 256 clock cycles. Although the second condition has been described as occurring in memory block 900 in the present example, it is understood that this second condition can occur in any one of memory blocks 900–915 during a particular refresh period.

If another idle cycle occurs before the RFTIM# signal is activated low, another refresh cycle will by executed by the memory block, activating the RFACK# signal and decreasing the count in up/down counter 1112 to zero.

Refresh accumulator 1102 therefore performs the averaging of the idle cycles available in a memory block over a refresh period between two refresh requests activated by the RFTIM# signal. The averaging effect increases the chances that the refresh operation in a memory block can be performed without forcing an idle cycle on the system bus by asserting the RFP# signal low. In the described example, as long as there is one idle cycle occurring in a refresh period in each memory block, then idle cycles will not be forced and the RFP# signal will not be activated. Longer averaging periods can be obtained by using up/down counters capable of higher counts.

Figure 13:
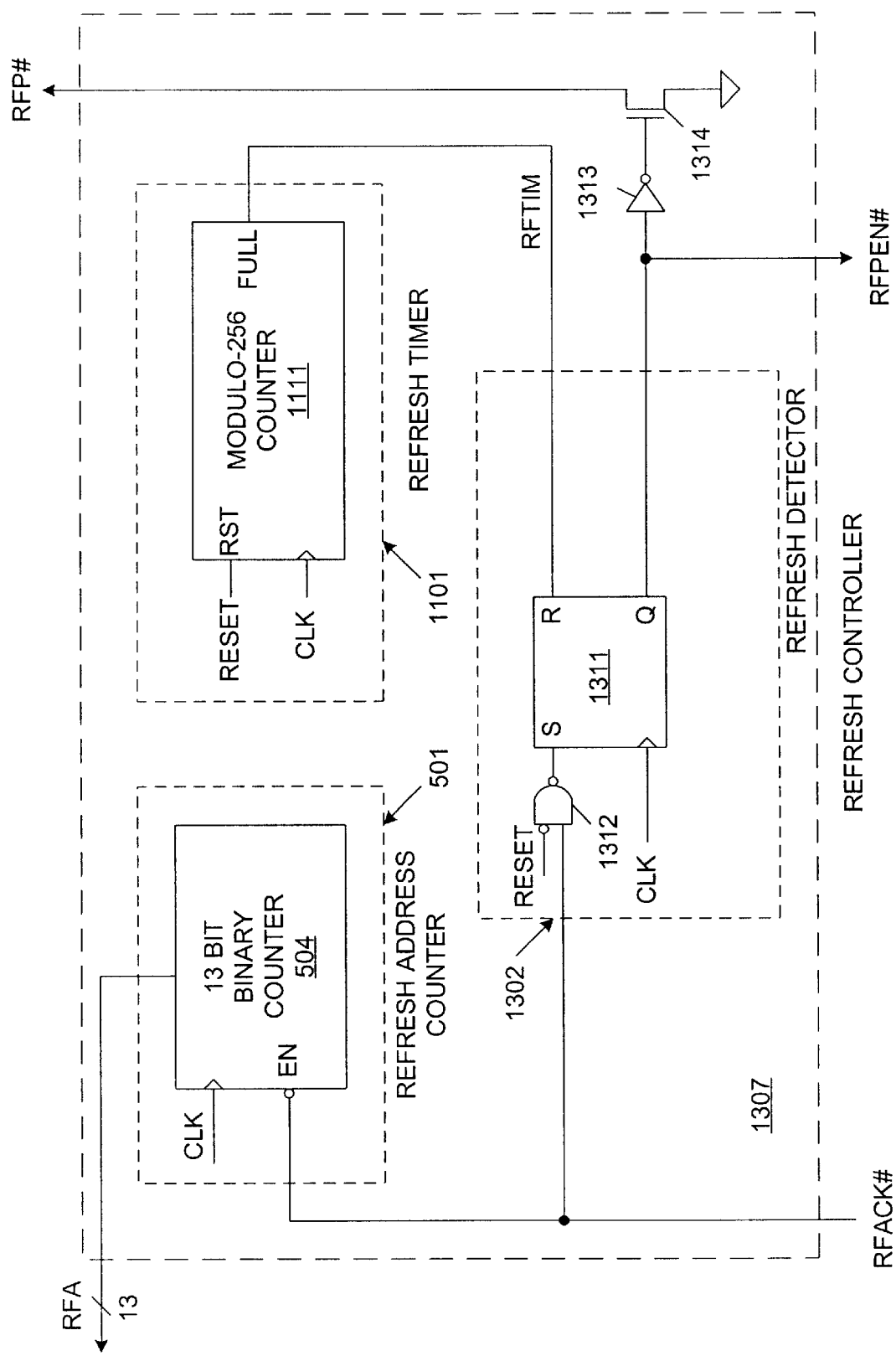
FIG. 13 is a block diagram of a refresh controller for use in the memory block of FIG. 10 in accordance with another embodiment of the present invention.
Figure 14:
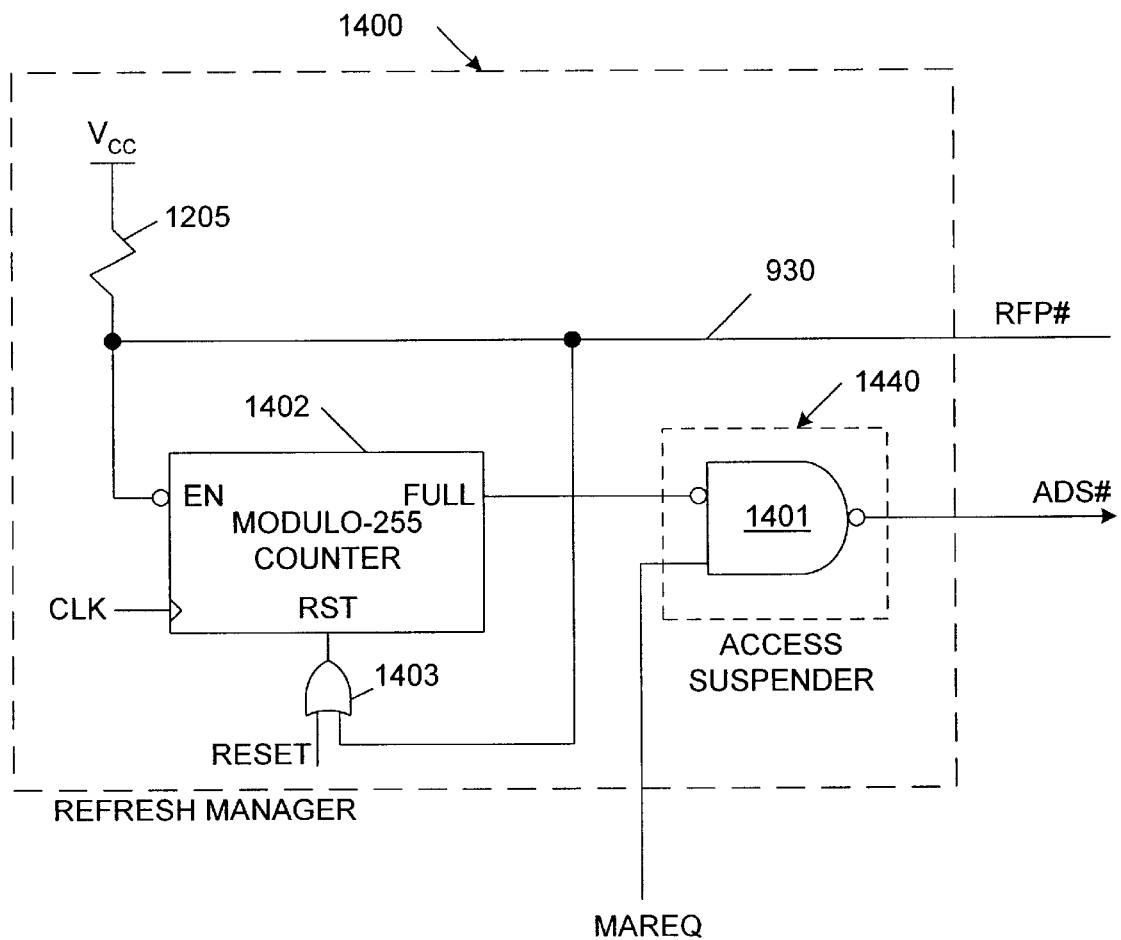
FIG. 14 is a schematic diagram of a refresh manager for use with the refresh controller of FIG. 14 in accordance with one embodiment of the present invention.

FIGS. 13 and 14 are block diagrams illustrating a refresh controller 1307 and a refresh manager 1400, respectively, in accordance with another embodiment of the present invention. Refresh controller 1307 replaces refresh controller 1007 in memory block 900 (FIGS. 10, 11). Refresh manager 1400 replaces refresh manager 1200 (FIG. 12). FIG. 13 is a block diagram of refresh controller 1307 in accordance with one embodiment of the present invention. Refresh controller 1307 includes refresh address counter 501, which has been described above in connection with FIG. 5. Refresh controller 1307 also includes refresh timer 1101, which has been described above in connection with FIG. 11. Refresh controller 1307 further includes refresh detector 1302, Inverter 1313 and n-channel pull-down transistor 1314.

Refresh detector 1302 includes set-reset (SR) flip-flop 1311 and NAND gate 1312. The set terminal of flip-flop 1311 is coupled to receive the output signal provided by NAND gate 1312. An inverting input terminal of NAND gate 1312 is coupled to receive the system RESET signal, and a non-inverting input terminal of NAND gate 1312 is coupled to receive the refresh acknowledge signal RFACK#. The reset terminal of flip-flop 1311 is coupled to receive the RFTIM signal provided by counter 1111. The Q output terminal of flip-flop 1311 provides the RFPEN# signal. The input terminal of inverter 1313 is coupled to receive the RFPEN# signal. The output terminal of inverter 1313 is coupled to the gate of pull-down transistor 1314. The source of transistor 1314 is coupled to ground, and the drain of transistor 1314 is coupled to RFP# line 930.

FIG. 14 is a schematic diagram of refresh manager 1400 in accordance with the present embodiment. Refresh manager 1400 includes access suspender 1440 (i.e., NAND gate 1401), resistor 1205, modulo-255 counter 1402 and OR gate 1403. Counter 1402 is enabled by a logic low RFP# signal, incremented by the CLK signal, and reset to a zero count by a logic high signal from OR gate 1403. The input terminals of OR gate 1403 are coupled to receive the system RESET signal and the RFP# signal. Counter 1402 provides a logic "1" output value to an inverting input terminal of NAND gate 1401 upon reaching a full count. If counter 1402 is not at a full count, this counter provides a logic "0" output value to the inverting input terminal of NAND gate 1401. The MAREQ signal is provided to a non-inverting input terminal of NAND gate 1401.

Refresh controller 1307 and refresh manager 1400 operate as follows. System RESET and clock CLK signals are provided to initialize and synchronize operations of counters 1111 and 1402. Upon initial power up, counters 1111 and 1402 are initialized to zero by the system RESET command. In addition, SR flip-flop 1311 is set to provide a logic "1" RFPEN# signal on its Q output terminal in response to the system RESET command. Counter 1111 then increments once each clock cycle up to a full count of 255. When counter 1111 reaches a full count, the RFTIM signal is asserted high, thereby initiating the first refresh period. Note that no refresh operations are performed during the first 256 cycles because the RFPEN# signal is de-asserted high.

When the RFTIM signal is asserted high, SR flip-flop 1311 is reset, such that flip-flop 1311 provides a logic low RFPEN# signal. In response, inverter 1313 provides a logic high signal to the gate of n-channel pull-down transistor 1314, thereby turning on transistor 1314. Turned on transistor 1314 pulls down on line 930, such that the RFP# signal is pulled down to a logic low value. At this time, each of memory blocks 900–915 has a logic low RFPEN# signal that causes line 930 to be pulled down.

Within refresh manager 1400, the logic low RFP# signal enables modulo-255 counter 1402. As a result, modulo-255 counter 1402 begins counting up from a zero count in response to the CLK signal. At this time, (as well as during the initial 256 clock cycles) the ADS# signal is responsive to the MAREQ signal, because counter 1402 provides a logic low FULL signal to the inverting input terminal of NAND gate 1401.

The ADS# signal may be asserted low for the next 256 clock cycles, such that a memory access occurs during each of the 256 clock cycles. In this case, there are two possible access patterns.

In the first possible access pattern, the same memory block is accessed for the entire 256 clock cycles. For example, memory block 900 may be accessed for the entire 256 clock cycles. In this example, each of memory blocks 901–915 will perform a refresh operation during the first clock cycle that memory block 900 is accessed. After 255 clock cycles, the RFPEN# signal in memory block 900 will remain asserted low, thereby causing transistor 1314 to continue to pull the RFP# signal down to a logic low state. At this time, counter 1402 reaches a full count, thereby providing a logic high FULL signal to the inverting input terminal of NAND gate 1401. In response, NAND gate 1401 provides a logic high ADS# signal. Memory block 900 responds to the high ADS# signal by performing a refresh operation. At this time, the refresh acknowledge signal RFACK# is asserted low. Within refresh controller 1307, this logic low RFACK# signal sets SR flip-flop 1311, thereby causing the RFPEN# signal to transition to a logic high state. In response, inverter 1313 provides a logic low value to the gate of pull-down transistor 1314, thereby turning off transistor 1314. Because the pull-down transistor in each of memory blocks 900–915 is turned off, the RFP# signal is pulled up to a logic high value. Within refresh manager 1400, this logic high RFP# signal disables counter 1402. The logic high RFP# signal also resets counter 1402 to a zero count. During the next clock cycle, the counters (e.g., counter 1111) in memory blocks 900–915 all reach a full count, and in response, provide logic high RFTIM signals. The logic high RFTIM signals reset the corresponding SR flip-flops (e.g., flip-flop 1311), thereby causing each to provide a logic low RFPEN# signal, and turn on the corresponding pull-down transistor (e.g., transistor 1314). At this time, the memory system is ready to begin another refresh cycle having a duration of 256 clock cycles.

Turning now the second possible access pattern, more than one memory block may be accessed during the 256 clock cycle period. For example, during a first cycle, memory block 900 may be accessed. During this first cycle, the non-accessed memory blocks 901–915 perform refresh operations. As a result, the RFACK# signals in these memory blocks 901–915 are asserted low, thereby de-asserting (high) the corresponding RFPEN# signals in these memory blocks. These high RFPEN# signals turn off the corresponding pull-down transistors in memory blocks 901–915. At this time, pull-down transistor 1314 in memory block 900 is the pull-down transistor causing the RFP# signal to remain low.

During a subsequent cycle, a memory block other than memory block 900 is accessed. During this subsequent cycle, memory block 900 performs a refresh operation. For example, memory block 915 might be accessed during the $100^{th}$ clock cycle. As a result, The RFACK# signal in memory block 900 is asserted low, the corresponding RFPEN# signal is de-asserted high, and the corresponding pull-down transistor 1314 is turned off. Because all of the memory blocks have performed a refresh operation, the RFP# signal is asserted high at this time, thereby disabling counter 1402. Moreover, the high RFPS# signal causes counter 1402 to be reset to a zero count. At the end of the 256 cycle period, the counters (e.g., counter 1111) in memory blocks 900–915 reach full counts, thereby resetting the corresponding RFPEN# signals to logic low states and turning on the corresponding pull-down transistors (e.g., transistor 1314). As a result, the RFP# signal is asserted low, thereby enabling counter 1402 to begin counting up from the zero count. Processing then continues in the above-described manner.

Note that if none of memory blocks 900–915 is accessed during one of the 256 clock cycles, the ADS# signal will be deasserted high (indicating an idle cycle). In response, each of memory blocks 900–915 will be allowed to perform a refresh operation during this idle cycle. At the end of this idle cycle, all of memory blocks 900–915 will be refreshed, the pull-down transistor in each of memory blocks 900–915 will be turned off, and the RFP# signal will be pulled up to a logic high value. Within refresh manager 1400, this logic high RFP# signal disables counter 1402. In addition, this logic high RFP# signal causes OR gate 1403 to provide a logic high signal to the reset terminal of counter 1402, thereby resetting counter 1402 to a zero count. Within refresh controller 1307, counter 1111 subsequently reaches a full count and in response, provides a logic high RFTIM signal. The logic high RFTIM signal resets SR flip-flop 1311, thereby providing a logic low RFPEN# signal, and turning on pull down transistor 1314. At this time, the memory system is ready to begin another refresh cycle having a duration of 256 clock cycles.

Although the invention has been described in connection with several embodiments, it is understood that this invention is not limited to the embodiments disclosed, but is capable of various modifications, which would be apparent to a person skilled in the art. For example, memory array 201 can have different sizes in different embodiments. In addition, in other embodiments a memory cycle may take place over multiple clock cycles. In this case, an idle cycle may also require multiple clock cycles. Furthermore, the entire memory system 1000 can be part of a larger system integrated in a single substrate. In this case, some common circuitry can be shared by all of the memory blocks. For example, only one refresh timer (e.g., refresh timer 1101) can be shared by all of memory blocks 900–915. Moreover, certain portions of the refresh manager circuit (portions other than the access suspender) can reside in the memory side of the system. For example, all of the circuit elements of refresh manager 1400, except for access suspender 1440, can be located in one or more of memory blocks 900–915 in one embodiment of the invention. In this embodiment, only access suspender 1440 would reside in memory controller 920. Another example is to use a daisy-chain serially connecting all the memory blocks to propagate the timing signal from a common refresh timer so that the refresh pending signals in the memory blocks are set sequentially. This scheme facilitates the memory refresh to be performed predominately, one block after another. This minimizes the power noise generated when the memory blocks perform refresh operations. Such a scheme is described in U.S. patent application Ser. No. 09/405,607. Thus, the invention is limited only by the following claims.

What is claimed is:

1. A method of operating a memory system having a memory block with an array of memory cells that require refresh, the method including:
   periodically asserting a timing signal;
   asserting a refresh pending signal when the timing signal is asserted;
   performing a refresh operation in the memory block if the refresh pending signal is asserted and an idle cycle exists in the memory block;
   de-asserting the refresh pending signal if the refresh operation is performed; and
   asserting an idle cycle request signal if the refresh pending signal is asserted for a predetermined time period.

2. The method of claim 1, further comprising forcing an idle cycle in the memory block if the idle cycle request signal is asserted.

3. A method of operating a memory system having a plurality of memory blocks, each having an array of memory cells that require refresh, the method including:
   periodically asserting a timing signal;
   asserting a refresh pending signal in each of the memory blocks when the asserted timing signal is received;
   within each of the memory blocks, performing a refresh operation if the refresh pending signal in the memory block is asserted and an idle cycle exists in the memory block;
   within each of the memory blocks, de-asserting the refresh pending signal in the memory block if a refresh operation is performed in the memory block; and
   asserting an idle cycle request signal if the refresh pending signal in any of the memory blocks is asserted for a predetermined period of time.

4. The method of claim 3, further comprising forcing an idle cycle in all of the memory blocks if the idle cycle request signal is asserted.

5. The method of claim 3, wherein the timing signal is generated in each memory block.

6. The method of claim 3, wherein the timing signal is provided to each of the memory blocks in parallel.

7. A method of operating a memory system having a memory block with an array of memory cells that require refresh, the method including:
periodically asserting a timing signal;
asserting a refresh pending signal when the timing signal is asserted;
performing a refresh operation in the memory block if the refresh pending signal is asserted and an idle cycle exists in the memory block;
asserting a refresh acknowledge signal in the memory block if a refresh operation is performed;
de-asserting the refresh pending signal if the refresh acknowledge signal is asserted;
asserting a refresh forcing signal if the refresh pending signal is asserted when the timing signal is asserted; and
forcing an idle cycle in the memory block if the refresh forcing signal is asserted.

8. A method of operating a memory system having a plurality of memory blocks, each having an array of memory cells that require refresh, the method including:
periodically asserting a timing signal;
asserting a refresh pending signal in each of the memory blocks when the asserted timing signal is received;
within each of the memory blocks, performing a refresh operation if the refresh pending signal in the memory block is asserted and an idle cycle exists in the memory block;
within each of the memory blocks, asserting a refresh acknowledge signal if a refresh operation is performed in the memory block;
within each of the memory blocks, de-asserting the refresh pending signal in the memory block if the refresh acknowledge signal is asserted in the memory block;
asserting a refresh forcing signal if the refresh pending signal in any of the memory blocks is asserted when the timing signal is asserted; and
forcing an idle cycle in all of the memory blocks if the refresh forcing signal is asserted.

9. The method of claim 8, wherein the timing signal is generated in each memory block.

10. A memory system comprising:
a system bus,;
a refresh timer configured to periodically assert a refresh timing signal;
a memory block coupled to the system bus, the memory block having:
an array of memory cells that require refresh;
a refresh detector coupled to the refresh timer, the refresh detector being configured to assert a refresh pending signal in response to an asserted refresh timing signal;
an access arbiter coupled to the refresh detector, the access arbiter being configured to enable a refresh operation to the array in response to detecting an asserted refresh pending signal during an idle cycle in the memory block, the access arbiter further being configured to assert a refresh acknowledge signal upon enabling a refresh operation;
means for providing the refresh acknowledge signal to the refresh detector, the refresh detector further being configured to de-assert the refresh pending signal in response to an asserted refresh acknowledge signal and assert an output signal when the refresh pending signal remains asserted for a predetermined time period; and
a logic circuit coupled to receive the output signal of the refresh detector, the logic circuit being configured to assert an idle cycle request signal if the output signal of the refresh detector is asserted.

11. The memory system of claim 10, further comprising a memory controller coupled to receive the idle cycle request signal on the system bus, the memory controller being configured to force an idle cycle on the system bus after receiving an asserted idle cycle request signal.

12. The memory system of claim 10, wherein the refresh detector comprises an up-down counter.

13. The memory system of claim 10, further comprising means for resetting the refresh timer and the refresh detector.

14. The memory system of claim 10, wherein the predetermined time period is a multiple of a period of the refresh timing signal.

15. The memory system of claim 10, wherein the logic circuit comprises:
a transistor having a gate coupled to receive the output signal of the refresh detector, a source coupled to a voltage supply terminal, and a drain coupled to a line of the system bus.

16. The memory system of claim 15, wherein the memory controller further comprises:
a resistor coupled between the line and a second voltage supply terminal; and
a logic gate having a first input terminal coupled to the line and a second input terminal coupled to receive an access request signal for the memory system.

17. A method of operating a memory system having a plurality of memory blocks, each having an array of memory cells that require refresh, the method including:
periodically asserting a timing signal;
asserting a refresh pending signal in each of the memory blocks when the asserted timing signal is received;
within each of the memory blocks, performing a refresh operation if the refresh pending signal in the memory block is asserted and an idle cycle exists in the memory block;
within each of the memory blocks, asserting a refresh acknowledge signal if a refresh operation is performed in the memory block;
within each of the memory blocks, de-asserting the refresh pending signal in the memory block if the refresh acknowledge signal is asserted in the memory block;
asserting a refresh forcing signal if the refresh pending signal in any of the memory blocks is asserted; and
forcing an idle cycle in all of the memory blocks if the refresh forcing signal is continuously asserted for a predetermined time period.

18. The method of claim 17, wherein the timing signal is generated in each memory block.

19. A memory system comprising:
a system bus having a refresh line;
a plurality of memory blocks coupled to the system bus, each memory block having:
an array of memory cells that require refresh;
a refresh timer configured to periodically assert a refresh timing signal;

a refresh detector coupled to the refresh timer, the refresh detector being configured to assert a refresh pending signal in response to an asserted refresh timing signal;

an access arbiter coupled to the refresh detector, the access arbiter being configured to enable a refresh operation to the array in response to detecting an asserted refresh pending signal during an idle cycle in the memory block, the access arbiter further being configured to assert a refresh acknowledge signal upon enabling a refresh operation;

means for providing the refresh acknowledge signal to the refresh detector, the refresh detector being configured to de-assert the refresh pending signal in response to an asserted refresh acknowledge signal; and a logic circuit coupled to receive the refresh pending signal, the logic circuit being configured to pull the refresh line of the system bus to a first voltage level if the refresh pending signal is asserted; and a memory controller coupled to the system bus, the memory controller being configured to force an idle cycle on the system bus if the memory controller detects that the refresh line is continuously pulled to the first voltage level for a predetermined time period.

20. The memory system of claim 19, wherein the refresh detector comprises a set-reset flip-flop.

21. The memory system of claim 19, further comprising means for resetting the refresh timer and the refresh detector.

22. The memory system of claim 19, wherein the logic circuit comprises a transistor having a gate controlled by the refresh pending signal, a source coupled to a voltage supply terminal, and a drain coupled to the refresh line of the system bus.

23. The memory system of claim 19, further comprising a resistor coupled between the refresh line and a second voltage supply terminal.

24. The memory system of claim 19, wherein the memory controller comprises a counter having an enable terminal coupled to the refresh line.

25. The memory system of claim 24, further comprising a logic gate coupled to receive a full indicator signal from the counter and an external memory access request signal, the logic gate providing an address strobe signal on the system bus.

26. The memory system of claim 25, wherein the refresh line is coupled to a reset terminal of the counter.

* * * * *

UNITED STATES PATENT AND TRADEMARK OFFICE
CERTIFICATE OF CORRECTION

PATENT NO. : 6,496,437 B2
DATED : December 17, 2002
INVENTOR(S) : Wingyu Leung

It is certified that error appears in the above-identified patent and that said Letters Patent is hereby corrected as shown below:

Title page,
Item [73], Assignee, should read -- Monolithic System Technology, Inc. --
Item [56], References Cited, U.S. PATENT DOCUMENTS,
"559,750 A  9/1896 Doska et al.." to -- 5,559,750 A  9/1996  Doska et al. --

Signed and Sealed this

Twenty-third Day of March, 2004

JON W. DUDAS
*Acting Director of the United States Patent and Trademark Office*